US012754878B2

(12) United States Patent
DeBenedictis

(10) Patent No.: US 12,754,878 B2
(45) Date of Patent: Oct. 6, 2026

(54) ADIABATIC CIRCUITS FOR COLD SCALABLE ELECTRONICS

(71) Applicant: ZETTAFLOPS LLC, Albuquerque, NM (US)

(72) Inventor: Erik DeBenedictis, Albuquerque, NM (US)

(73) Assignee: ZETTAFLOPS LLC, Albuquerque, NM (US)

(*) Notice: Subject to any disclaimer, the term of this patent is extended or adjusted under 35 U.S.C. 154(b) by 813 days.

(21) Appl. No.: 17/764,105

(22) PCT Filed: Sep. 10, 2020

(86) PCT No.: PCT/US2020/050269
§ 371 (c)(1),
(2) Date: Mar. 25, 2022

(87) PCT Pub. No.: WO2021/067023
PCT Pub. Date: Apr. 8, 2021

(65) Prior Publication Data

US 2022/0342845 A1 Oct. 27, 2022

Related U.S. Application Data

(63) Continuation of application No. 16/588,963, filed on Sep. 30, 2019, now Pat. No. 10,817,463.

(51) Int. Cl.
*G06F 15/82* (2006.01)
*G11C 11/412* (2006.01)
(Continued)

(52) U.S. Cl.
CPC ............ *G06F 15/82* (2013.01); *G11C 11/412* (2013.01); *G11C 11/418* (2013.01); *H03H 11/34* (2013.01);
(Continued)

(58) Field of Classification Search
CPC ......... H03K 19/195; H03K 3/38; H10N 60/12
See application file for complete search history.

(56) References Cited

U.S. PATENT DOCUMENTS 5,521,538 A * 5/1996 Dickinson .......... H03K 19/0019 326/95
7,875,876 B1 * 1/2011 Wandzura .............. G06N 10/40 257/26

(Continued)

FOREIGN PATENT DOCUMENTS

CN 209373392 U 9/2019
EP 2600349 A1 * 6/2013 ........... G11C 11/412

(Continued)

OTHER PUBLICATIONS

J.M. Hornibrook et. al., "Cryogenic Control Architecture for Large-Scale Quantum Computing", Physical Review Applied, vol. 3, No. 2, Feb. 23, 2015 (Year: 2015).*

(Continued)

*Primary Examiner* — Seokjin Kim
(74) *Attorney, Agent, or Firm* — LOZA & LOZA, LLP; Kevin L. Soules

(57) ABSTRACT

A system and method comprising a cryogenic adiabatic circuit in a cryogenic environment and a clock generator at a higher temperature, the circuit's clock lines can be connected across the temperature gradient to the clock generator, where the clock generator runs below the frequency that would yield power dissipation equal to the static dissipation of a functionally equivalent CMOS circuit at room temperature, resulting in lower power for the function than possible at room temperature irrespective of the speed of operation.

20 Claims, 19 Drawing Sheets

(51) Int. Cl.

| | |
|---|---|
| ***G11C 11/418*** | (2006.01) |
| ***H03H 11/34*** | (2006.01) |
| ***H03K 17/92*** | (2006.01) |
| ***H03K 19/195*** | (2006.01) |
| *H10N 60/10* | (2023.01) |
| *H10N 60/12* | (2023.01) |

(52) U.S. Cl.

CPC ........... *H03K 17/92* (2013.01); *H03K 19/195* (2013.01); *H10N 60/12* (2023.02); *H10N 60/128* (2023.02)

(56) References Cited

U.S. PATENT DOCUMENTS

| | | | | |
|---|---|---|---|---|
| 9,495,644 | B2 * | 11/2016 | Chudak | G06N 10/60 |
| 9,520,180 | B1 * | 12/2016 | Mukhanov | G01R 33/0354 |
| 9,780,765 | B2 | 10/2017 | Naaman et al. | |
| 10,797,684 | B1 * | 10/2020 | Benz | H03K 3/38 |
| 10,817,463 | B1 * | 10/2020 | DeBenedictis | H03K 17/92 |
| 11,941,482 | B1 * | 3/2024 | Rigetti | G06N 10/40 |
| 2007/0239366 | A1 * | 10/2007 | Hilton | G16C 10/00 703/11 |
| 2011/0054876 | A1 * | 3/2011 | Biamonte | G06N 10/40 703/15 |
| 2015/0263736 | A1 | 9/2015 | Herr et al. | |
| 2016/0189054 | A1 | 6/2016 | Papile | |
| 2016/0267032 | A1 * | 9/2016 | Rigetti | G06N 10/40 |
| 2017/0052846 | A1 * | 2/2017 | DeBenedictis | G06F 11/10 |
| 2017/0177534 | A1 * | 6/2017 | Mohseni | H10N 60/805 |
| 2018/0062404 | A1 | 3/2018 | Kesterson | |
| 2019/0188596 | A1 * | 6/2019 | Ipek | G06F 7/381 |
| 2019/0296743 | A1 * | 9/2019 | Pedram | G06F 15/7867 |
| 2021/0096616 | A1 * | 4/2021 | Ware | H05K 7/20372 |
| 2022/0224996 | A1 * | 7/2022 | Nickerson | H04Q 11/0005 |

FOREIGN PATENT DOCUMENTS

| | | | | |
|---|---|---|---|---|
| EP | 2100376 | B1 | 1/2018 | |
| JP | 2013054793 | A | 3/2013 | |
| KR | 20140071063 | A | 6/2014 | |
| WO | WO-2023196707 | A1 * | 10/2023 | G06N 10/40 |

OTHER PUBLICATIONS

PCT/US2020/050269. International Search Report & Written Opinion (Oct. 6, 2020). 7 pages.

Chin et al.; "The potential of functional scaling"; IEEE Circuits and Devices Magazine; IEEE Service Center, Piscataway, NJ, US; vol. 21, No. 1, pp. 27-35; Jan. 1, 2005; XP011126248.

Homulle et al.; "A reconfigurable cryogenic platform for the classical control of quantum processors"; Review of Scientific Instruments; American Institute of Physics, Melville, NY, US; vol. 88, No. 4; Apr. 7, 2017; XP012217825.

Hornibrook et al.; "Cryogenic control architecture for large-scale quantum computing"; Physical Review Applied; vol. 3, No. 2, p. 024010; Feb. 23, 2015; XP055295774.

Veldhorst et al.; "Silicon CMOS architecture for a spin-based quantum computer"; arxiv.org; Cornell University Library, 201 Olin Library Cornell University Ithaca, NY, US; Sep. 30, 2016; XP081360779.

Extended European Search Report, European Patent Application No. 20872447.6, Mar. 20, 2024, 4 pgs.

Franke, David P., et al. "Rent's rule and extensibility in quantum computing." Microprocessors and Microsystems 67, https://arxiv.org/pdf/1806.02145; 8 pages (Jun. 7, 2018).

Debenedictis, Erik P., et al. "The National Quantum Initiative Will Also Benefit Classical Computers [Rebooting Computing]." Computer 51.12, https://www.osti.gov/servlets/purl/1528997; 5 pages (Dec. 1, 2018).

Anantharam, Venkiteswaran, et al. "Driving Fully-Adiabatic Logic Circuits Using Custom High-Q MEMS Resonators." ESA/VLSI. 2004. http://citeseerx.ist.psu.edu/viewdoc/download?doi=10.1.1.84.5099&rep=rep1&type=pdf (see doc title 07-Driving_fully-adiabatic_logic_circuits_u.pdf), 7 pages (2004).

Younis, Saed G., "Asymptotically Zero Energy Computing Using Split-Level Charge Recovery Logic", No. AI-TR-1500. Massachusetts Inst of Tech Cambridge Artificial Intelligence Lab, ttps://apps.dtic.mil/dtic/tr/fulltext/u2/a290054.pdf (see appendix A p. 93 for discussion of 77 K cryo), 114 pages (Jun. 1994).

Debenedictis, Erik P., Disclosure document (see 10-SCE_2LAL_FPGA_Planner-5g.pdf), 5 pages (Dec. 31, 2018).

Vandersypen, L. M. K., et al. "Interfacing spin qubits in quantum dots and donors—hot, dense, and coherent." npj Quantum Information 3.1, https://www.nature.com/articles/s41534-017-0038-y, 10 pages (Sep. 6, 2017).

Veldhorst, M., et al. "Silicon CMOS architecture for a spin-based quantum computer." Nature communications 8.1, https://www.nature.com/articles/s41467-017-01905-6, 8 pages (2017).

Ye, Yibin, et al. "On The Design of Adiabatic SRAMs." ECE Technical Reports (1996): Paper 104, https://docs.lib.purdue.edu/cgi/viewcontent.cgi?article=1104&context=ecetr, 27 pages (Apr. 1, 1996).

De Simoni, Giorgio, et al. "Metallic supercurrent field-effect transistor." Nature nanotechnology 13.9 (2018), 8 pages (Jun. 5, 2018).

Fourie, Coenrad J.. et al. "An RSFQ superconductive programmable gate array." IEEE transactions on applied superconductivity vol. 17, No. 2, (see doc title 16-An RSFQ Superconductive Programmable-04277393), 4 pages (Jun. 2007).

Katam, Naveen Kumar, et al.. "Superconducting magnetic field programmable gate array." IEEE Transactions on Applied Superconductivity, vol. 28, No. 2, 12 pages (Mar. 2018).

Mcdermott, R., et al. "Quantum-classical interface based on single flux quantum digital logic." Quantum science and technology 3.2, https://arxiv.org/pdf/1710.04645.pdf, 16 pages (Oct. 13, 2017).

Li, Ruoyu, et al. "A crossbar network for silicon quantum dot qubits." Science advances vol. 4, No. 7, eaar3960, https://advances.sciencemag.org/content/4/7/eaar3960.full, and supplemental materials, 23 pages (Jul. 6, 2018).

Naaman, Ofer et al. "Josephson junction microwave modulators for qubit control." Journal of Applied Physics 121.7 (2017): 073904. https://arxiv.org/pdf/1610.07987, 18 pgs (Feb. 24, 2017).

Okuma, Yukihiro et al. "Design and Demonstration of an Adiabatic-Quantum-Flux-Parametron Field-Programmable Gate Array Using Josephson-CMOS Hybrid Memories." IEEE Transactions on Applied Superconductivity 29.8, pp. 1-6 (2019).

Schaal, Simon et al. "A CMOS dynamic random access architecture for radio-frequency readout of quantum devices." Nature Electronics 2.6. pp. 236-242 (2019).

Pauka, S. J. et al. "A cryogenic interface for controlling many qubits." arXiv preprint arXiv:1912.01299. https://arxiv.org/pdf/1912.01299.pdf, pp. 1-7 (Dec. 4, 2019).

Frank, Michael Patrick et al. "Reversibility for efficient computing". (Manuscript, Based on Ph.D. Thesis) Dept. of Electrical Engineering and Computer Science, 432 pgs. (Dec. 20, 1999).

Athas, William C. "Energy-recovery CMOS." Low Power Design Methodologies. Springer, Boston, MA, pp. 65-100 (1996).

Engseth, Henrik et al. "Room temperature interface for RSFQ digital signal processor.", IEEE transactions on applied superconductivity vol. 17, No. 2, pp. 979-982 (Jun. 2007).

Schaal, Simon et al. "A CMOS dynamic random access architecture for radio-frequency readout of quantum devices.", Nature Electronics 2.6, 10 pgs. (2019).

European Office Action, European Patent Application No. 20872447.6, Jul. 20, 2026, 6 pgs.

Takeuchi et al., "An adiabatic quantum flux parametron as an ultra-low-power logic device", Superconductor Science and Technology. IOP Publishing, Techno House, Bristol., GB, vol. 26, No. 3, Jan. 28, 2013, p. 35010, XP020241465.

* cited by examiner

ADIABATIC CIRCUITS FOR COLD SCALABLE ELECTRONICS

CROSS-REFERENCE TO RELATED APPLICATIONS

This application is a 371 of International Application Number PCT/US2020/050269, filed Sep. 10, 2020. PCT/US2020/050269 is a continuation of U.S. application Ser. No. 16/588,963 filed Sep. 30, 2019. This application claims the benefit of priority from U.S. patent application Ser. No. 16/588,963 filed on Sep. 30, 2019, the disclosure of the foregoing application being incorporated herein by reference in its entirety for all applicable purposes.

TECHNICAL FIELD

Embodiments are generally related to the field of electronics. Embodiments are also related to the field of computing systems. Embodiments are also related to the field of quantum computing systems. Embodiments are further related to the field of cold electronics. Embodiments are also related to cold, scalable electronics used for computational tasks. Embodiments are also related to cold, scalable electronics used in association with quantum computing applications. Embodiments are further related to adiabatic transistor circuits associated with cold electronics.

BACKGROUND

People have been busy scaling up electronic computers for nearly a century, but without much regard for their operating temperature. As a result, applications requiring nonstandard temperature conditions have been treated as special cases.

Due to the size of the computer industry, there are highly refined design processes for nearly any conceivable combination of room-temperature electronic devices. Laptops and smartphones commonly use CMOS for logic, DRAM for memory, and Flash for storage. Theoretically, a computer could be made of just two or even one of these device types, but the resulting system would be suboptimal because the designer would not have the freedom to implement internal tasks with devices optimized for those tasks.

Cryogenic design processes are not as technologically mature. For logic, the designer has a choice of Josephson junction-based Single Flux Quantum (SFQ) and cryo CMOS, but there are no good memory options. Furthermore, SFQ and cryo CMOS are at extreme ends of a spectrum: both are about the same speed, but SFQ uses about 10,000× as much chip area while cryo CMOS uses about 10,000× as much energy per logic operation.

Quantum computers are now in the public eye for potential large-scale applications. However, quantum computers based on some qubit types require operation near absolute zero. A central issue is therefore how the energy required for computation varies with temperature, particularly for the non-quantum, or classical, electronics that controls the qubits. Today's ubiquitous CMOS uses nearly the same amount of energy at any temperature T where it works in the first place. However, the resulting heat must be removed to room temperature (nominally 300 K) by a cryogenic refrigeration system. If refrigerators were 100% Carnot efficient, a total of 300 K/T would be drawn from the wall plug and ultimately dissipated into the 300 K environment. Refrigerators are not 100% Carnot efficient, leading to, for example, power multipliers closer to 1,000× for computation at liquid Helium temperatures of 4 K and 1,000,000× or more at typical qubit temperatures of 15 mK.

The physical limits of computation, such as Landauer's minimum dissipation, are expressed in entropy units of kT, where k is Boltzmann's constant. As the operating temperature T goes down, so does the minimum energy, so it is reasonable to consider if actual devices become more energy efficient as they are cooled.

"Rent's rule" relates to the observation that the number of external interface wires per internal component generally decreases as one moves up a system's hierarchy, with the rate of decrease correlating with the system's scalability. Rent's rule has been extended to cold electronics, where it applies to the number of wires between temperature stages and the amount of logic at each stage. However, even Rent's rule does not properly account for the energy consequences of processing data at a nonstandard temperature T. Heat generated at temperature T has to be removed by a refrigerator that imposes an energy overhead, with the amount of heat also varying because the energy efficiency of most electronic devices depends on temperature.

Thus, scalability in cold electronics is intrinsically dependent on giving the designer a set of devices, circuits, and architectures that are energy efficient at temperature T, where T is a property of each stage. For applications where the coldest temperature is substantially lower than room temperature, there is a need in the art for systems and methods that provide energy-efficient adiabatic circuits for cold, scalable electronics as disclosed herein.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method, system, and apparatus for cold, scalable electronics.

It is an aspect of the disclosed embodiments to provide methods and systems for computing.

It is an aspect of the disclosed embodiments to provide methods and systems for supercomputing applications.

It is an aspect of the disclosed embodiments to provide methods and systems for control systems.

It is an aspect of the disclosed embodiments to provide methods and systems for quantum computing controls.

It is an aspect of the disclosed embodiments to provide methods and systems for adiabatic circuits for cold, scalable electronics.

Embodiments disclosed herein illustrate how cryogenic adiabatic transistor circuits can expand the range of applications of cold electronics and increase the performance of those applications at scale. Cold, scalable electronics are required for computational tasks that include a scalable information processing payload that only functions correctly when cold, such as sets of sensors, qubits, or cryogenic computing components. The payload's behavior can be defined as q(N), where q is the functional behavior of the payload and N is the number of sensor elements, qubits, the size of the computational problem, or more generally, the scale factor. The significance of a scalable cryogenic payload is most easily seen in quantum computing, where computer scientists project the quantum speedup of an algorithm by analyzing the algebraic expression for q(N).

In applications where the payload runs cold, data to and from the payload can be routed across the temperature gradient in steps. This is illustrated in FIG. 1A with stages shown at exemplary temperatures of 300 K, 4 K, and 15 mK. The table also indicates various logic options and memory-like options. The choice of three stages, specific temperatures, and the range of device options listed in FIG. 1A is exemplary, and other options may be selected according to design considerations.

To address the need above, the embodiments disclosed herein advance the state of the art of cryogenic adiabatic transistor circuits. Specifically, the embodiments detailed herein present new ways to create and apply cryogenic versions of adiabatic transistor circuits at a given temperature T, with the ability to trade speed for energy efficiency over many orders of magnitude.

FIG. 1B illustrates the available devices for addressing this need. A broad range of "Beyond CMOS" devices, are shown in the upper lasso 150. These options all lie above a line of constant energy-delay product with CMOS fairly close to this curve. If the devices in the upper lasso 150 were the only ones available, the only approach would be to push the devices further and further toward the right where the energy is less.

However, the lower lasso 155 shows superconducting devices that use less energy. However, it is cumbersome and expensive to run a system cold, as required for such superconducting devices. If, however, a system must be run cold for some other reason, such as the ability to interface to qubits, sensors, or special computing devices that require cold, this expense may be required and the lower-energy devices are therefore preferable.

In the embodiments disclosed herein, the design options can include both devices in the upper lasso 150 (although the devices may be moved to the right in FIG. 1B) and devices in the lower lasso 155 used in exemplary embodiments, at the speeds indicated in FIG. 1B.

In an embodiment, cryogenic adiabatic transistor circuits can be applied as the memory-like part of a hybrid with another technology such as Josephson junctions or CMOS, as shown in FIG. 2 as function $f_4$. The term "memory-like" as used herein, refers to structures whose purpose is to hold information or state, such as shift registers, flip flops, and the like, including, but not limited to, random-access memories that predominate the consumer marketplace. The embodiments include a series of architectural structures that use adiabatic technology to buffer data like field programmable gate array (FPGA) configurations and digitized waveforms for use by the faster logic technology, thus providing enhanced scalability.

The value of the embodiments can easily be seen in quantum computing applications. As stated above, quantum speedup can be projected from q(N), but the speedup including the control system will be given by equation (1) as follows:

$$f(N)=(f_{300}\circ f_{4}\circ f_{0.015}\circ q)(N) \tag{1}$$

wherein $f_t$ relates to the function at the stage operating at temperature t and q(N) represents the behavior of the payload. With the embodiments disclosed herein, the control system will not impose excessive overhead. Thus, maximizing the amount of the payload's performance available at room temperature.

For example, in an embodiment a system can comprise a cryogenic adiabatic circuit in a cryogenic environment and a clock generator at a higher temperature, the circuit's clock lines can be connected across the temperature gradient to the clock generator, where the clock generator runs below the frequency that would yield power dissipation equal to the static dissipation of a functionally equivalent CMOS circuit at room temperature, resulting in lower power for the function than possible at room temperature irrespective of the speed of operation. The transistors in the cryogenic environment can be optimized for low leakage at the temperature of the cryogenic environment, resulting in even lower power. The adiabatic circuit can be memory-like, resulting in a cryogenic, energy-efficient, dense information storage system.

In an embodiment of the system, the control signal connects to the gate of a superconductor FET, creating an energy-efficient method of modulating the critical current of superconductor FETs via multiplexed signals from room temperature.

In an embodiment, the system further comprises a type 2 device, such as a Josephson junction, where the overall function is comprised of type 1 subfunctions requiring large device count but low speed and type 2 subfunctions that require high-speed devices, where the type 1 subfunctions are implemented using cryogenic adiabatic transistor circuits and the type 2 subfunctions are implemented using the second type of device, thus implementing functions that require both high speed and large numbers of devices. The system can be a conventional computer, where the type 1 subfunction is memory and the type 2 subfunction is a processor, thus creating a system that can have a large amount of memory due to the large number of semiconductor devices but also operates at high speed due to the speed of the second type of device. The superconductor FETs configure the behavior of a reconfigurable structure based on Josephson junction logic, thus creating a semiconductor-superconductor hybrid logic system.

In an embodiment, a quantum computer control system is provided that splits the storage of a waveform across a multiplicity of waveform stores and includes a multiplicity of multiplexers to combine the stores into a single, faster stream, thus providing waveforms whose bandwidth exceeds the maximum speed of the first type of device.

The system can have a sensor array as a payload, where the output of the sensor array becomes the input to the system, the second type of device preprocesses the signal into more numerous parallel data streams and the first type of device stores and processes the data streams, thus creating a signal processing front end for a cryogenic sensor that preprocesses the signals with less energy than would be required to send the signals to room temperature for processing.

In certain embodiments, a method for creating a system for computing a function at a low-temperature is disclosed. The method can comprises the following steps: (1) dividing the function in to an adiabatic-eligible portion that is amenable to parallelization with the remainder designated a high-speed portion, (2) computing the energy efficiency profile of the adiabatic technology at the low temperature, (3) computing the desired amount of parallelism in the adiabatic-eligible portion in order to minimize the sum of the cost of devices plus the cost of energy, both of which are functions of the degree of parallelism, thus creating a computing system that offers the lowest cost to compute a function through control of temperature, adiabatic circuit operation, and parallelism. In this method, the adiabatic-eligible portion is implemented by semiconductors and the process further comprises a step (4) where optimization is additionally performed over transistor gate dielectric thickness, and step (5) where the semiconductor process is varied to create transistors with the optimal dielectric thickness, thus creating a computing system that offers the lowest cost to compute a function through control of temperature, adiabatic circuit operation, parallelism, and thickness of transistor gate dielectric.

In certain embodiments of the method, the adiabatic-eligible portion is implemented by semiconductors and the high-speed portion is implemented by Josephson junctions, and the process further comprises: step (4) fabrication of the semiconductor portion on a silicon wafer, and step (5) fabrication of the Josephson junction portion on top of the partially completed wafer from the previous step, thus creating a single chip with the entire system.

In other embodiments, a cryogenic adiabatic circuit is disclosed that is connected to a room temperature external processor, where the processor can load and update control signal values stored in the circuit, and the outputs of the circuit connect via wires to capacitive nodes that make control signal values available to other parts of the system, creating a subsystem for producing analog AC/DC cryogenic control signals at a lower power per control signal than possible with non-adiabatic circuits, and with fewer wires across the temperature gradient than possible without multiplexing.

The cryogenic adiabatic circuit can be a 1-of-N decoder driving each row of an array of access transistors through each transistor's gate, where the sources on the transistors in each column connect to a column driver circuit, each access transistor's drain further being connected to a capacitive node and representing a control signal, creating a subsystem for producing analog AC/DC cryogenic control signals at lower power per control signal than possible with non-adiabatic row addressing. This can comprise DRAM with an adiabatic row addressing only and arbitrary column drive.

The column driver circuit can be a cryogenic column driver, creating a subsystem for producing digital cryogenic control signals at lower power per control signal than possible with non-adiabatic circuits. In this case, the embodiment can comprise DRAM with an adiabatic row addressing and column drive, but digital.

In certain embodiments, the control signal connects to the gate of a superconductor FET, creating an energy-efficient method of modulating the critical current of superconductor FETs via multiplexed signals from room temperature.

In certain embodiments, the control signal connects to the gate of semiconductor FET that may pass or block an SFQ pulse from a Josephson junction circuit, creating an energy-efficient method controlling an SFQ circuit via multiplexed signals from room temperature.

The adiabatic circuit can be a tapped adiabatic SRAM, yielding a system with high density due to the compact SRAM cell structure yet with stability because SRAM does not require refresh.

In the embodiments describe herein, the control signals can affect Josephson junction-based microwave circuits, resulting in a lower power system for generating and analyzing a multiplicity of microwave signals.

The control signals can configure a Josephson junction-based FPGA-like structure, containing configurable logic elements and a programmable routing network, resulting in a cryogenic FPGA with the performance of SFQ logic but without the overhead of transistor-based configuration logic. A configuration buffer stores multiple configurations that can be switched quickly, thus permitting more complex behaviors than otherwise possible with large SFQ gates. The system can include a branch signal from the configured logic to the configuration buffer, where the signal causes a configuration change to a specified new configuration.

In certain embodiments, the transistors can have their leakage current rebalanced for cryogenic operation, resulting in higher energy efficiency.

In certain embodiments, the control signals control quantum operations of a spin qubit quantum computer, resulting in a lower power system for controlling spin qubits than is possible at room temperature or without signal multiplexing. The system can include memory connected to a Josephson junction-based processor, thus creating a system that can have a large amount of memory due to the large number of semiconductor devices, that operates at high speed due to the speed of the Josephson junctions.

In certain embodiments the clock rate is a monotonic function of the operating temperature, thus creating a computing system whose energy per operation decreases dynamically with temperature to reduce total energy consumption of the cryogenic refrigerator plus electronic circuits.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1A:
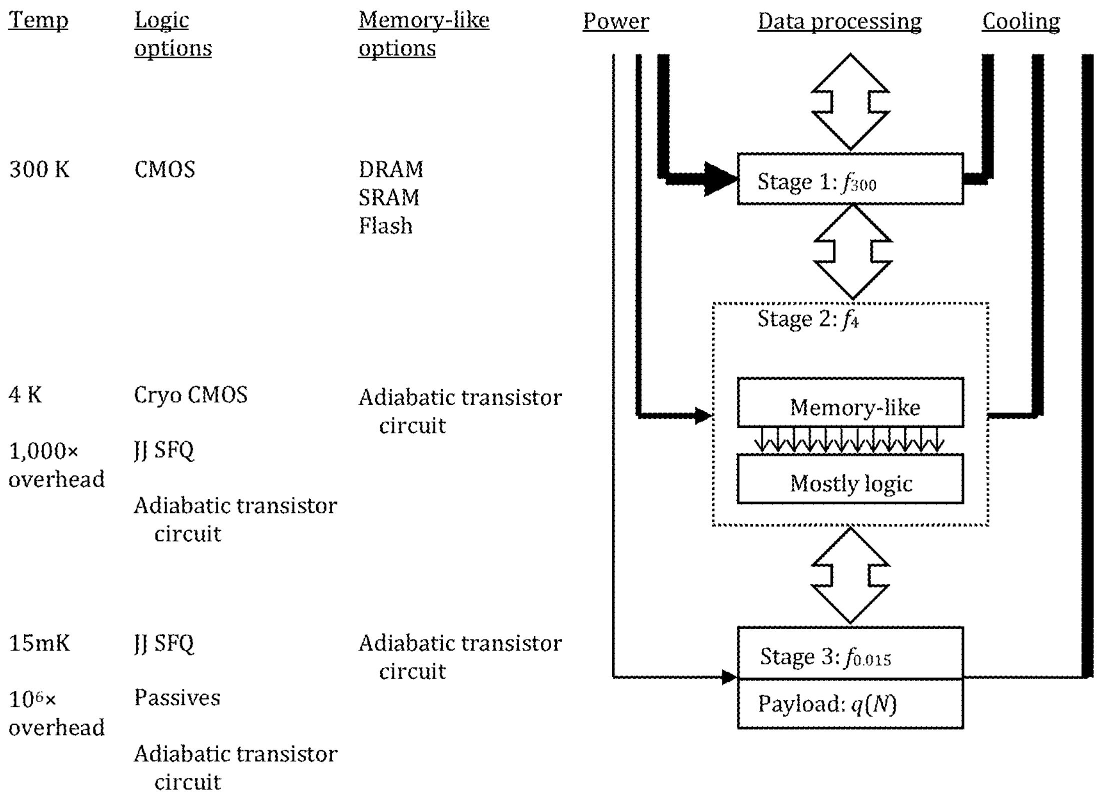
FIG. 1A depicts a diagram illustrating the task associated with the disclosed embodiments.

The particular values and configurations discussed in the following non-limiting examples can be varied, and are cited merely to illustrate one or more embodiments and are not intended to limit the scope thereof.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and," "or," or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. In addition, the term "based on" may be understood as not necessarily intended to convey an exclusive set of factors and may, instead, allow for existence of additional factors not necessarily expressly described, again, depending at least in part on context.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
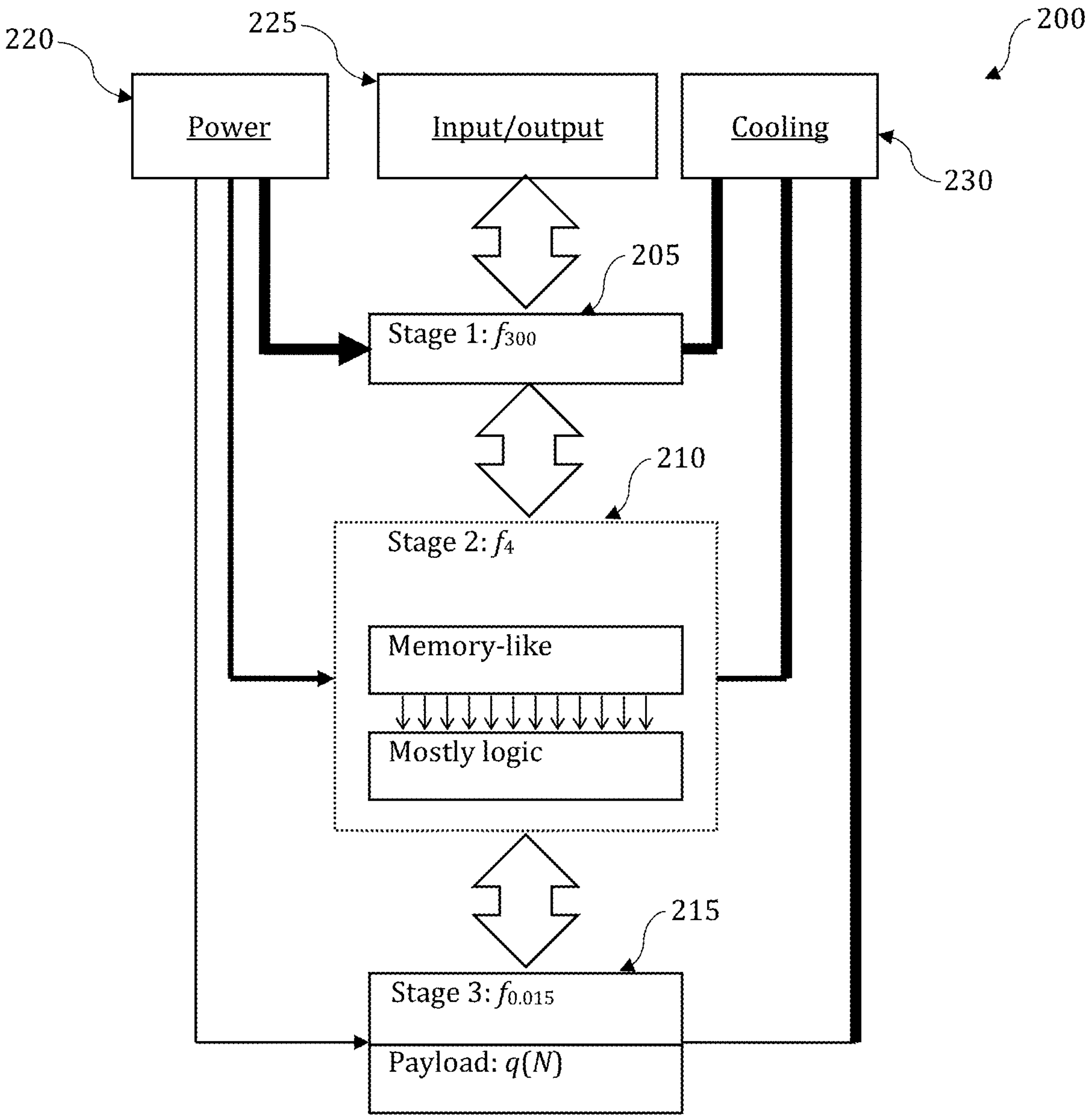
FIG. 2 depicts a system for cold, scalable electronics used for computational tasks, in accordance with the disclosed embodiments.

The embodiments disclosed herein make use of cryogenic adiabatic transistor circuits that can expand the range of applications of cold electronics and increase the performance of those applications at scale. An exemplary overview of the embodiments is illustrated in FIG. 2, which illustrates a system 200 for cold scalable electronics.

Cold, scalable electronics are required for computational tasks that include a scalable information processing payload that only functions correctly when cold. As used herein, the phrase "cold electronics," or the phrase "cold, scalable electronics" refer to systems where the payload requires an absolute temperature of 10% or less than the warmest stage in the system. Examples of such scalable information processing payloads include, but are not limited to sensors, qubits, and cryogenic computing components.

The disclosed embodiments, directed cryogenic adiabatic transistor circuits, provide new ways to create and apply cryogenic versions at a given temperature T, and with the ability to trade speed for energy efficiency over orders of magnitude.

In an embodiment, cryogenic adiabatic transistor circuits can be applied as the memory-like part of a hybrid with another technology such as Josephson junctions or cryo CMOS. The embodiments further include a series of architectural structures that use the adiabatic technology to buffer data (e.g. FPGA configurations and digitized waveforms) for use by faster logic technology, providing better scalability in accordance with the disclosed embodiments.

FIG. 2 thus illustrates architecture of a system 200 used to perform the function of equation (1), distributed over stage 1 205, stage 2 210, and stage 3 215, and a scalable, cryogenic payload function q(N). An objective of the disclosed embodiments is to achieve the best performance of $f(N)=(f_{300}\circ f_4\circ f_{0.015}\circ p)(N)$ at any scale N, with performance including performance per unit of energy (e.g. Joules). Since the overall task is scalable, data transfer bandwidth between stages can be scalable. The architecture can further include a power supply 220, an input/output 225, and a cooling system 230 which may comprise a refrigerator, cryocooler, or other such apparatus, in which case performance includes the energy of both the circuit and the cooling system 230.

FIGS. 3A-3E illustrate operational schematics of two-level adiabatic logic (2LAL) adiabatic circuits, in accordance with the disclosed embodiments. 2LAL is based on transmission gates 305.

Figure 3A:
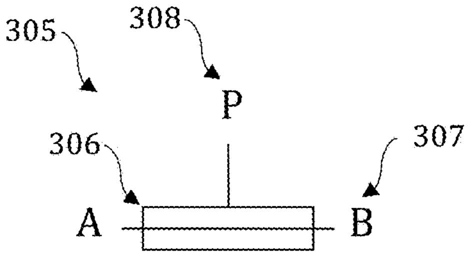
FIG. 3A depicts a transmission gate symbol, in accordance with the disclosed embodiments.
Figure 3B:
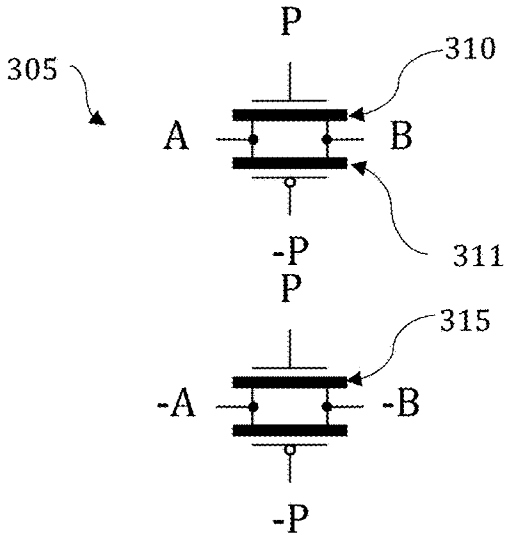
FIG. 3B depicts a transmission gate schematic, in accordance with the disclosed embodiments.

A transmission gate 305 comprises an n-type 310 and a p-type FET 311 connected at their respective sources and drains. A schematic of a transmission gate 305 is illustrated in FIG. 3B. This two-transistor structure acts like a single-pole-single-throw switch, connecting the A side 306 and B side 307, when P 308 is true, and like an open circuit when P 308 is false. All signals in 2LAL are dual rail, meaning every A is accompanied by a −A elsewhere in the circuit, so the schematic for a transmission gate 305, comprises two pairs of transistors with inverted signals on the sources and drains.

Figure 3C:
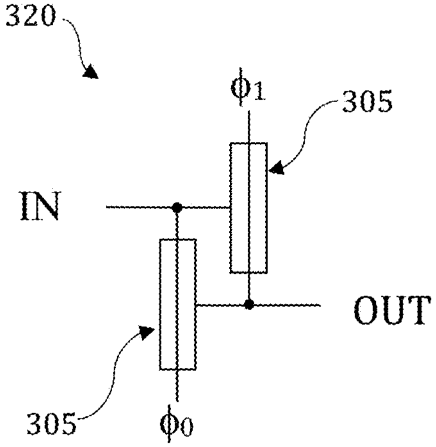
FIG. 3C depicts a 2LAL shift register stage, in accordance with the disclosed embodiments.
Figure 3D:
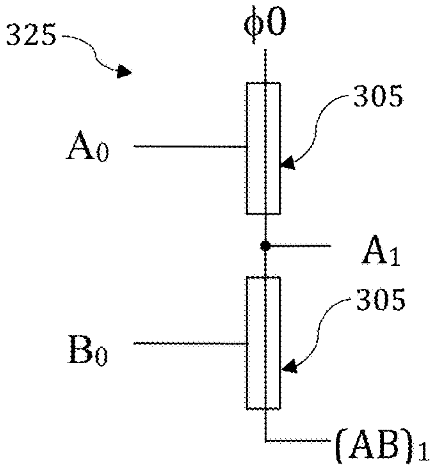
FIG. 3D depicts a 2LAL AND gate, in accordance with the disclosed embodiments.

One phase of a 2LAL shift register 320 is illustrated in FIG. 3C. A 2LAL shift register can comprises four repetitions of the two transmission gate structure shown in FIG. 3C, the repetitions differing by advancing phases of a four-phase clock. A logic family can be built around 2LAL, with a 2LAL AND function 325 illustrated in FIG. 3D FIG. 3E shows, a schematic of a 2LAL logic system 350 which includes the four combined clock and power supply waveforms 355-358, notably generated in a room temperature environment 365 and transported to the circuit 375 through superconducting wires 360 (where the signal is in an environment cold enough for superconductivity).

Figure 3E:
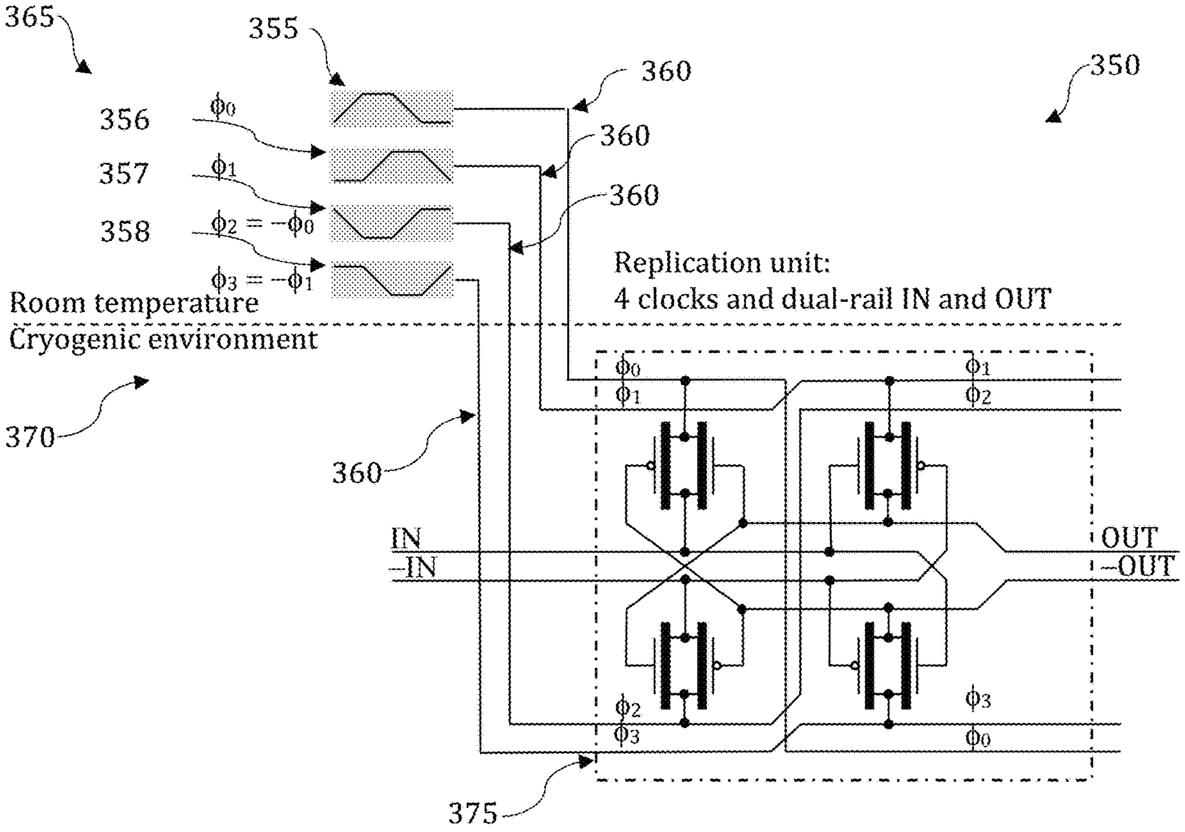
FIG. 3E depicts a 2LAL shift register circuit with a room temperature clock driver, in accordance with the disclosed embodiments.

In FIG. 3E the circuit 375 comprises one of four phases of a shift register 320, illustrated schematically. It should be appreciated that the circuit 375 can more generally comprise any member of the 2LAL logic family. Since the 2LAL logic family contains a universal gate set, only four wires 360 are required between the room-temperature signal generator and the cryogenic environments 370 irrespective of the complexity of the logic. In other embodiments, additional wires can be added for I/O and/or if special voltages are required. It should be appreciated that other adiabatic logic families, such as split level change recovery logic (SCRL), use different numbers of combined clock and power supply signals, and can be considered part of the disclosure provided herein.

As disclosed herein, cryogenic operation can make adiabatic transistor circuits practical for applications relevant to cold electronics. Adiabatic transistor circuits can use voltage-based signaling on wires, which act as capacitors. The signal energy is $\frac{1}{2}CV^2$. The difference between these circuits and CMOS is whether this energy is turned into heat in a cryogenic environment, where it is subject to refrigeration overhead, or at room temperature where it is not.

Figure 4:
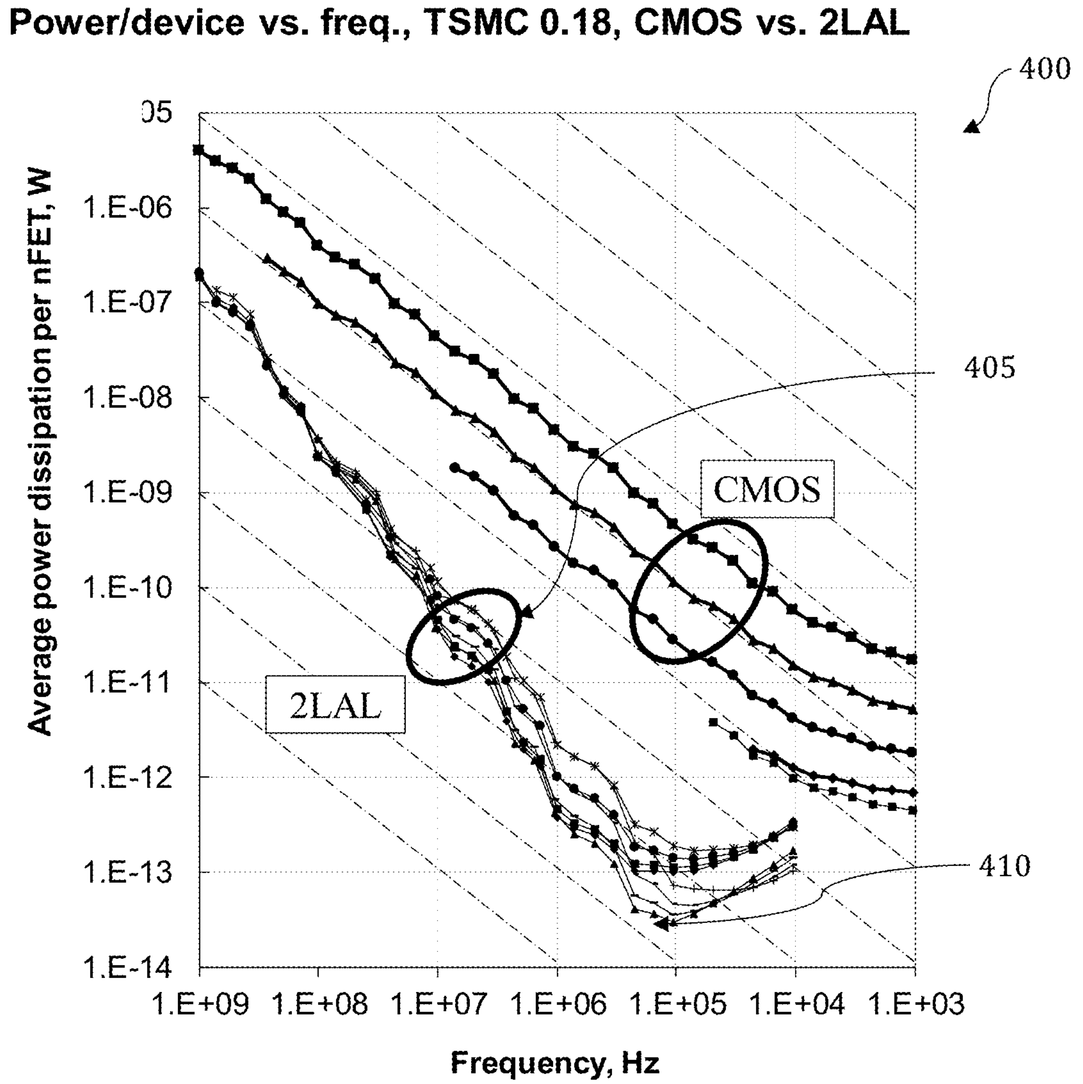
FIG. 4 depicts a power versus frequency chart, in accordance with the disclosed embodiments.

FIG. 4 illustrates a chart 400 of standard CMOS inverters and the same transistors wired into an adiabatic shift register of the 2LAL circuit design as described herein. On a log-log scale, the curves show power dissipation of standard CMOS declines as a function of clock period, or inverse clock frequency, with slope −1 (linear) while 2LAL has slope −2 (quadratic).

Unlike CMOS circuits' DC power supply, adiabatic circuits' combined clock and power supply waveforms 355 have smooth ramps of slope ±dV/dt, or change in voltage over time, that is proportional to frequency. These ramps create current I=CdV/dt, at the design point of low voltage drop across the transistors, which causes $I^2R$ losses in the transistors' channels. As the clock period lengthens, I declines linearly but PR drops quadratically, thus causing the 2LAL power curve 405 in FIG. 4 to decline with slope —2. In other words, the quadratic decline is due to the combined effect of fewer operations and less dissipation per operation.

Thus, adiabatic circuits dissipate only a portion of the signal energy in the transistor's channel with the rest going up the wire to the power supply—which is in the temperature (e.g. approximately 300 K) of the environment 365 and not subject to refrigeration overhead. This explanation shows how the transistors in the CMOS devices (CMOS HP and CMOS LP) in FIG. 1B can move along the curve of constant energy-delay product when used in an adiabatic circuit.

A critical aspect of the embodiments disclosed herein is what happens to the energy when it arrives at the power supply. As explained above, adiabatic circuitry eliminates the refrigeration overhead of 1,000× to 1,000,000× irrespective of what may or may not happen at the power supply. For operation at 4 K or lower, this is enough of an energy savings to make adiabatic circuits practical. The embodiments disclosed herein therefore make adiabatic transistor circuits practical by using cryogenic operation instead of, for example, an energy recycling power supply.

Furthermore, it is another aspect of the disclosed embodiments to extend adiabatic speed range (i.e. in the downward sloping region in FIG. 4). In certain aspects, the embodiments include a hybrid technology where speed can be accomplished using Reciprocal Quantum Logic (RQL), CMOS, or the like. The adiabatic circuits can provide a memory, state, or large amounts of logic where the value is in its complexity not its speed. For example, FIG. 4 is verification that transistorized 2LAL can be very energy efficient in applications where speed is not essential. Generally speaking, the curves in chart 400, level off on the right at the region 410, at the point where transistors have the full power supply voltage across two terminals, caused by a combination of gate or source-drain leakage.

Transistors optimized for room temperature can benefit from cooling. Total device leakage is the sum of temperature-independent gate leakage plus temperature-dependent source-drain leakage—where the two leakages can be traded off against each other by varying gate dielectric thickness. Assuming a fixed operating voltage, a gate dielectric thickness can be selected so that the gate and source-drain leakages are the same at room temperature, as shown on the left of FIG. 5.

Figure 5:
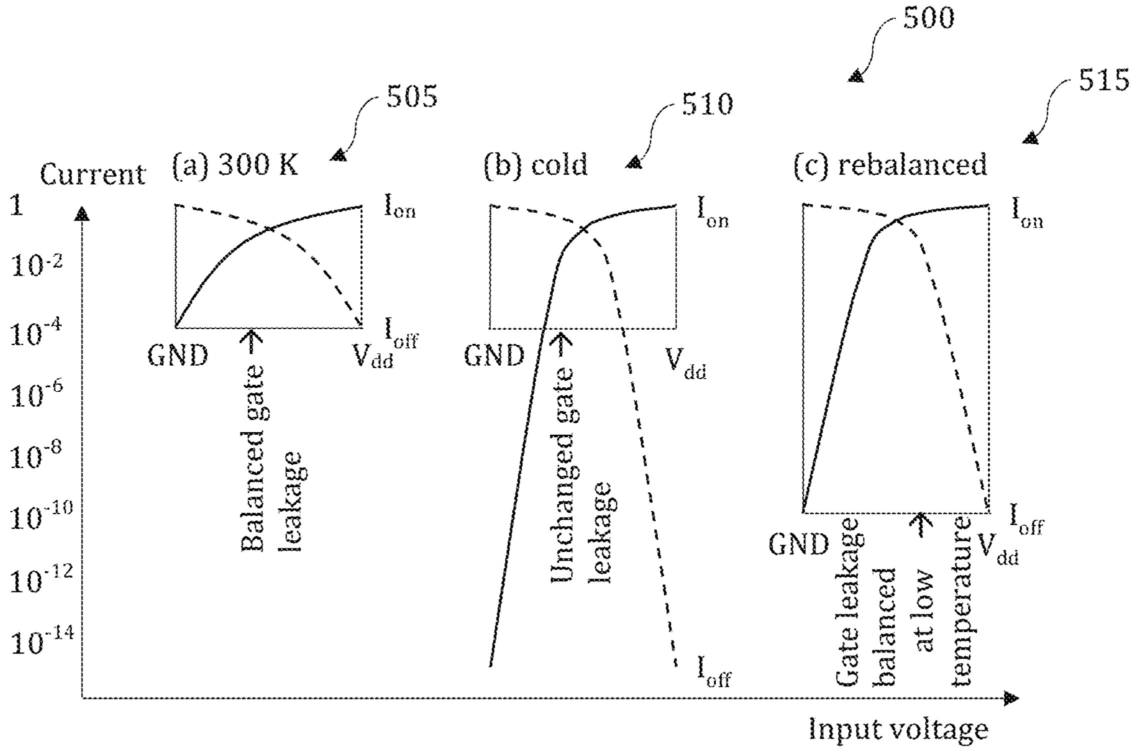
FIG. 5 depicts a current versus voltage chart for transistors at various temperatures, illustrating the strategy for optimizing transistor design, in accordance with the disclosed embodiments.

FIG. 5 illustrates current as a function of input voltage associated with rebalancing transistors in accordance with the disclosed embodiments. Chart 505 illustrates power dissipation optimization at 300 K, which suggests balancing source-drain and gate leakage. Chart 510 illustrates that source-drain leakage drops significantly at cryogenic temperatures, but that this will not make much difference. However, Chart 515 illustrates the rebalanced result showing that the process can be optimized for cryogenic operation.

Cryogenic operation causes steepening of the subthreshold slope and a reduction in source-drain leakage, as shown in center of FIG. 5, leaving gate leakage as the dominant factor in total leakage. If the leakages were balanced to begin with, the unchanging gate leakage should limit the adiabatic energy savings to about a factor of two, which is not enough to satisfy the needs of cold electronics.

It is easy to change the supply voltage. Even, a modest reduction will reduce gate leakage while increasing source-drain leakage, tending to bring the two into balance at a lower level of total leakage. While this is desirable, the amount of reduction in supply voltage is limited by the threshold voltage, which is not temperature dependent, so reducing the supply voltage may be helpful, but may not be completely sufficient.

Accordingly, more energy efficient cryogenic memory-like circuits are possible even without changing the physical structure of transistors. Both CMOS and 2LAL logic gates can be used for data storage, as illustrated by the shift register in FIG. 4. Transistors have the same leakage characteristics irrespective of whether they have been wired into a CMOS or a 2LAL circuit, so all the curves in FIG. 4 have the same dissipation in the zero-frequency limit if they had been simulated with the same operating points.

As such, cryogenic adiabatic circuits, as disclosed herein, can be an effective memory option for some combinations of speed, power, and density. Logic is usually rated by speed and energy per operation, but memory can be useful for holding data even if it does very few operations. Memory is also rated by density, which generally means small devices are better.

CMOS SRAM can have somewhat fewer transistors than an adiabatic memory due to the simplicity of the circuits for address decoders and cells. For the same transistors, CMOS can have an advantage at the lowest speed range. However, cryogenic adiabatic transistor circuits, as disclosed herein, will have much lower energy per operation and will operate at lower power at even modest frequencies. Josephson junctions are huge compared to transistors. Therefore, both CMOS and cryogenic adiabatic transistor circuits have an advantage in density.

In certain embodiments, transistors can be optimized for lower temperature by making the gate dielectric thicker than the room-temperature optimum until the gate and source-drain leakages are the same at a lower temperature. As total leakage is reduced, the qualitative result is an extension of the region in FIG. 4 with downward slope −2, 410, before $I_{off}$ and static leakage cause a leveling off.

In certain embodiments, adiabatic scaling of an RQL-2LAL hybrid can be realized. Josephson junction chips are fabricated by evaporating a superconductor, such as Niobium, onto a blank silicon wafer. To manufacture a hybrid, the process starts with a completed silicon wafer instead of a blank one.

Figure 6A:
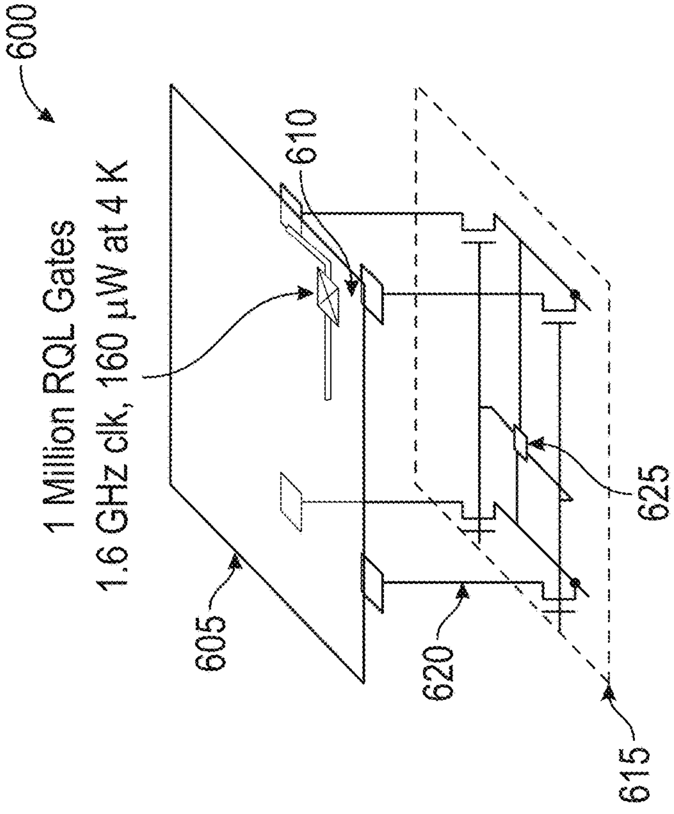
FIG. 6A depicts a baseline CMOS hybrid, in accordance with the disclosed embodiments.
Figure 6B:
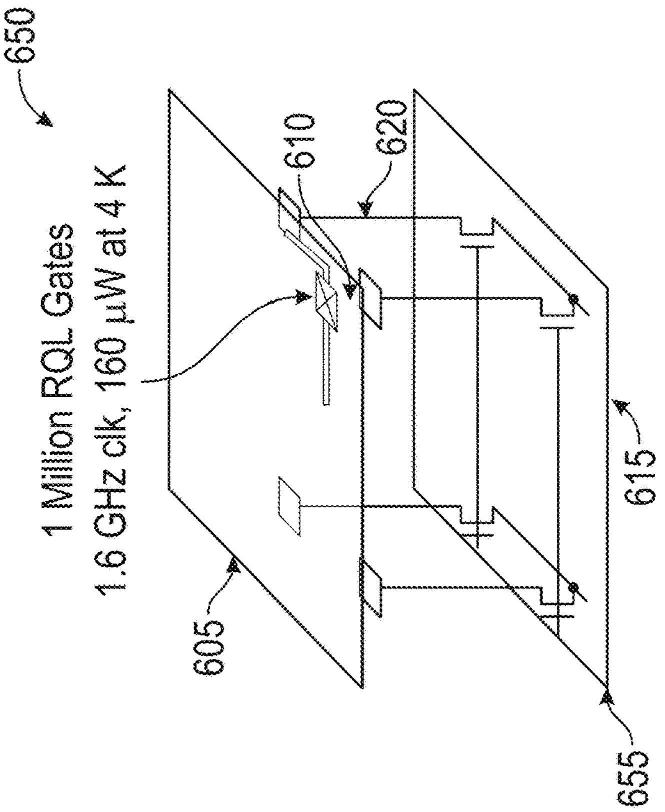
FIG. 6B depicts an adiabatically scaled semiconductor-superconductor hybrid, in accordance with the disclosed embodiments.

Hybrid chips 600 and 650 illustrated in FIGS. 6A and 6B. FIGS. 6A and 6B illustrate the relevant parameters of the hybrid design, which can be computed using the performance figures provided for CMOS and RQL provided in FIG. 1B.

FIG. 6A illustrates a hybrid chip 600 with CMOS, and hence no adiabatic scaling. Hybrid chip 600 includes the upper layer 605 filled with gates 610. As illustrated in FIG. 6A, the upper layer 605 can include, for example, 1 million RQL gates. It should be appreciated that the number of gates and values provided in FIG. 6A and FIG. 6B are exemplary and that other numbers of gates and values may also be used.

Hybrid chip 600 further includes a lower layer 615 connected to the upper layer 605 via connections 620. The lower layer 615 can includes CMOS gates 625. In FIG. 6A, the CMOS gates 625 represent 1,000 CMOS gates. With little or no adiabatic scaling, the semiconductor CMOS gates 625 add process complexity but the number of gates isn't enough to make a difference to the design.

FIG. 6B illustrates a hybrid chip 650 with adiabatic scaling available at cryogenic temperatures. Hybrid chip 650 includes the same upper layer 605 filled with gates 610 where the upper layer 605 can comprise a Josephson junction filled with, for example, 1 million RQL gates. However, the lower layer 615 can comprise, for example, 100 million semiconductor 2LAL gates 655 (far more than the 1 million SFQ gates of hybrid chip 600) that allows hybrid chip 650 to address more complex problems.

Thus, using adiabatic scaling, hybrid chip 600 can be filled with gates 625 comprising CMOS transistors, while the hybrid chip 650 can be filled with gates 655 comprising transistors comprising 2LAL circuits. It should be noted that the difference in the operating points for hybrid chips 600 and 650 is governed so that the power dissipation of the two layers is equal. The rest of the semiconductor layer 615 can be left empty (i.e. it is dark silicon).

Adiabatic scaling, as described herein refers to changing the clock period of an adiabatic circuit, but adjusting the number of gates on the chip so the total chip power is unchanged. For example, a chip with g adiabatic gates operating at clock rate c could have its clock rate lowered to c/10. Each gate will dissipate 1/100th the power, but in lieu of reducing power at the chip level, the gate count increases to 100 g and power at the chip level stays the same.

Table 1 illustrates an exemplary process of three adiabatic scaling steps of 10× clock period and 100× gate count for the system illustrated in FIG. 6A and FIG. 6B. However, the first step switches the circuit design from CMOS to 2LAL, the latter of which is assumed to be 10× more complex, so the first increase in gate count will be 10× instead of 100×. In table 1, superscripts (1) (2) and (3) indicate the scaling step.

TABLE 1

| ADIABATIC SCALING | | | |
|---|---|---|---|
| Baseline | | | |
| $N_{RQL}$ | $f_{RQL}$ | $P_{RQL}$ | $P_{Static}$ |
| 1M | 1.6 GHz | 160 μW | n/a |
| $N_{CMOS}$ | $f_{CMOS}$ | $P_{CMOS}$ | $P_{Static}$ |
| 1K | 4 GHz | 160 μW | n/a |
| A thousand extra gates, useful for voltage-based signalling | | | |
| Scaling Step 1 | | | |
| $N_{RQL}$ | $f_{RQL}$ | $P_{RQL}$ | $P_{Static}$ |
| 1M | 1.6 GHz | 160 μW | n/a |
| $N^{(1)}_{2LAL}$ | $f^{(1)}_{2LAL}$ | $P^{(1)}_{2LAL}$ | $P^{(1)}_{Static}$ |
| 10K | 400 MHz | 160 μW | 16.7 nW |
| Ten thousand slower gates, useful for voltage-based signalling | | | |
| Scaling Step 2 | | | |
| $N_{RQL}$ | $f_{RQL}$ | $P_{RQL}$ | $P_{Static}$ |
| 1M | 1.6 GHz | 160 μW | n/a |
| $N^{(2)}_{2LaL}$ | $f^{(2)}_{2LaL}$ | $P^{(2)}_{2LaL}$ | $P^{(2)}_{Static}$ |
| 1M | 40 MHz | 160 μW | 1.67 μW |
| Doubles gate count, but the new gates are slow | | | |
| Scaling Step 3 | | | |
| $N_{RQL}$ | $f_{RQL}$ | $P_{RQL}$ | $P_{Static}$ |
| 1M | 1.6 GHz | 160 μW | n/a |
| $N^{(3)}_{2LaL}$ | $f^{(3)}_{2LaL}$ | $P^{(3)}_{2LaL}$ | $P^{(3)}_{Static}$ |
| 100M | 4 MHz | 160 μW | 167 μW |
| Similar resource mix to logic + memory, but also computes | | | |

As illustrated in Table 1 (which provides exemplary values for illustrative purposes only), the energy per operation E, propagation delay $t_{pd}$, and clock rate f (assuming 500 gate delays per clock cycle) for RQL, CMOS, and 2LAL from FIG. 2 yields equations (2) and (3) as follows:

$$E_{RQL}=0.1\text{ aJ},t_{pd,RQL}=1.25\text{ ps},f_{RQL}=1.6\text{ GHz} \quad (2)$$

$$E_{CMOS}=40\text{ aJ},t_{pd,CMOS}=0.5\text{ ps},f_{CMOS}=4\text{ GHz} \quad (3)$$

Assuming a million-gate RQL chip, where $N_{RQL}$=1 M gates, the superconductor layer can dissipate according to equation (4):

$$P_{RQL}=N_{RQL}\times f_{RQL}\times E_{RQL}=160\ \mu\text{W at 4 K} \quad (4)$$

which corresponds to $N_{CMOS}$=1 K gates.

A growing $P_{STATIC}$ power due to leakage can also be calculated. To calculate leakage power (assuming a 1 V supply voltage, 3 KΩ on resistance), $I_{ON}/I_{OFF}=10^8$ at a 50% duty cycle.

Scaling step 3 involves making 2LAL into memory (resulting in the hybrid chip 650 illustrated in FIG. 6B). This scaling step yields $N_{RQL}$=1 M fast RQL gates and $N^{(3)}_{2LAL}$=100 M transistorized gates running at 4 MHz, which comprises a resource mix similar to logic and memory in standard microprocessor systems. However, 2LAL is actually a logic family, and the embodiments disclosed herein provide ways of using 2LAL gates, at scaling step 3, for important functions applicable to cold electronics applications. Furthermore, the speed of gates in scaling steps 1 and 2 fit in between the speed of scaling step 3 gates and RQL, making them suitable for speed matching.

The properties of a cryo CMOS-2LAL hybrid are also illustrated Table 1 and FIGS. 6A and 6B, by ignoring the RQL layer 610, and assuming all the transistor circuits 655 are intermixed on a chip. 2LAL's advantage in energy efficiency is so large that it should be used wherever possible. In the disclosed embodiments, this can limit cryo CMOS to functions that do not have a parallel implementation, or to activities that require generation of high-speed signals.

Control systems for spin qubits are an exemplary application for a cryo CMOS-2LAL hybrid. An alternate embodiment can comprise a cryo CMOS-2LAL hybrid on a monolithic chip all at a single temperature. The hybrid can include interface electronics to a qubit-containing payload and control electronics.

Figure 7:
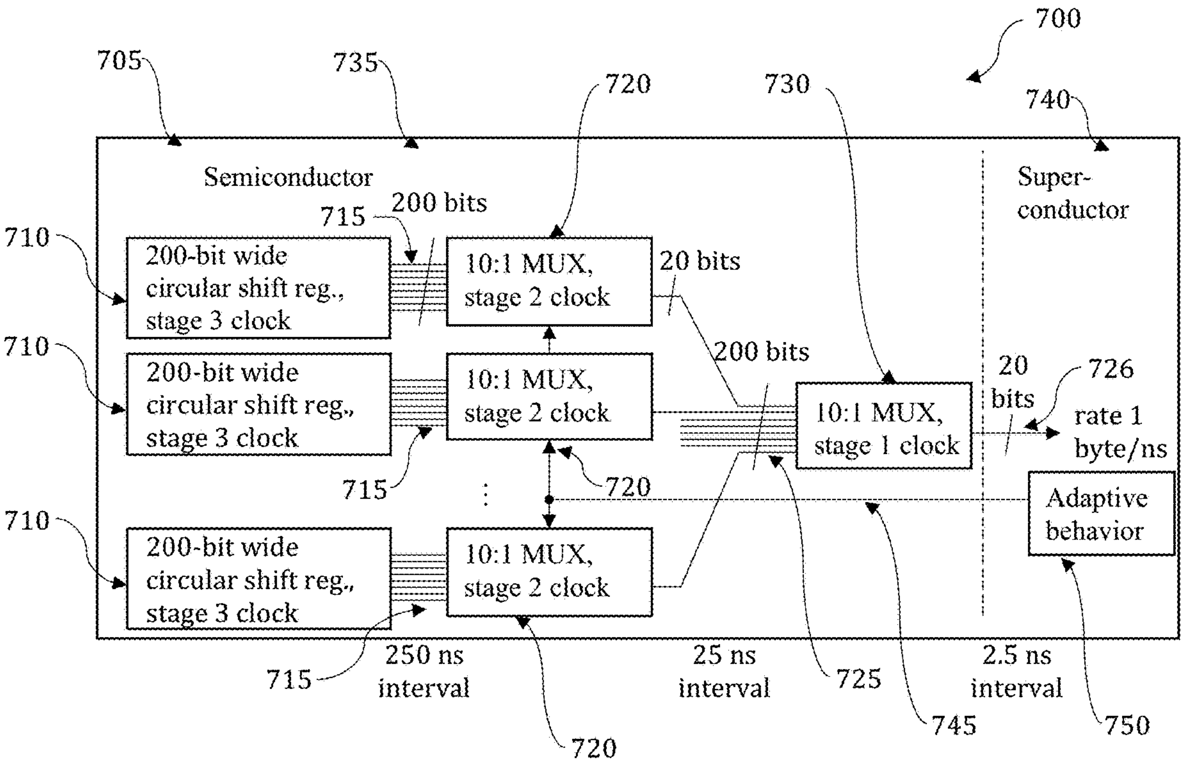
FIG. 7 depicts the architecture of a memory-like shift register component, in accordance with the disclosed embodiments.

Commercial memories almost always allow random access, but the combination of fast random-access times and high density is not feasible at cryogenic temperatures. FIG. 7 illustrates a system 700 comprising a high capacity, high bandwidth memory-like structure 705 that can be used for sequential storage in accordance with the disclosed embodiments. The values provided in FIG. 7 are meant to be exemplary. In other embodiments other values can be used.

The system 700 includes a series of circular 2LAL shift registers 710, built from gates of scaling step 3, each connected to a 10:1 multiplexer 720 built from gates of scaling step 2, and yet again to a 10:1 multiplexer 730 built from gates of scaling step 1. This circuit causes data, at the highly parallel output of the storage elements 715, to become less parallel by a factor of 10 but speed up by a factor of 10 as it flows to data pathway 725. This process repeats from data pathway 725 to the final data transferred to the superconductor layer at 1 GB/s by data pathway 726.

All the components from shift registers 710 through multiplexer 730 can be configured on a semiconductor layer 735. The output from multiplexer 730 can then be sent to the superconducting layer 740 of the system 700. To meet power requirements, the semiconductors 735 must be slowed down to meet control signal requirements. However, the multiplexing scheme embodied in FIG. 7, involving both the semiconductors 735 and much faster superconductors 740, suffices to match speeds.

The system 700 in FIG. 7 stores data in a serial shift register built with gates from scaling step 3 illustrated in FIG. 6B. This allows sequential access at $f^{(3)}_{2LAL}$=4 MHz, or 1 GB/sec (assuming the shift register is 2,000 bits wide, as used in the exemplary embodiment illustrated in FIG. 7). If the register loops back on itself, it can be loaded during the system boot process and the contents used many times. The shift registers may be as long as necessary to meet application storage needs, subject to chip size limitations.

It should be noted that transferring this data directly to RQL would require 2,000 receivers running at 1/1,250 of their maximum speed. To make more efficient use of resources, the structure 700 can include 10:1 multiplexers 720 using gates from scaling step 2 to create, for example, a 200-bit wide stream clocked at 40 MHz. A second level of multiplexers 745 creates a 20-bit wide stream at 400 MHz. Thus, the system 700 can comprise a circuit that has a data density similar to a memory but uses 2LAL's variable speed logic to process the data into a stream suitable for the much faster RQL logic.

In certain embodiments, energy efficient digital control signals can be employed. Specifically, in certain embodiments a circuit derived from DRAM for generating control signals in a cryogenic environment can be modified to improve energy efficiency by addressing logic based on a cryogenic adiabatic logic family, such as 2LAL.

Figure 8A:
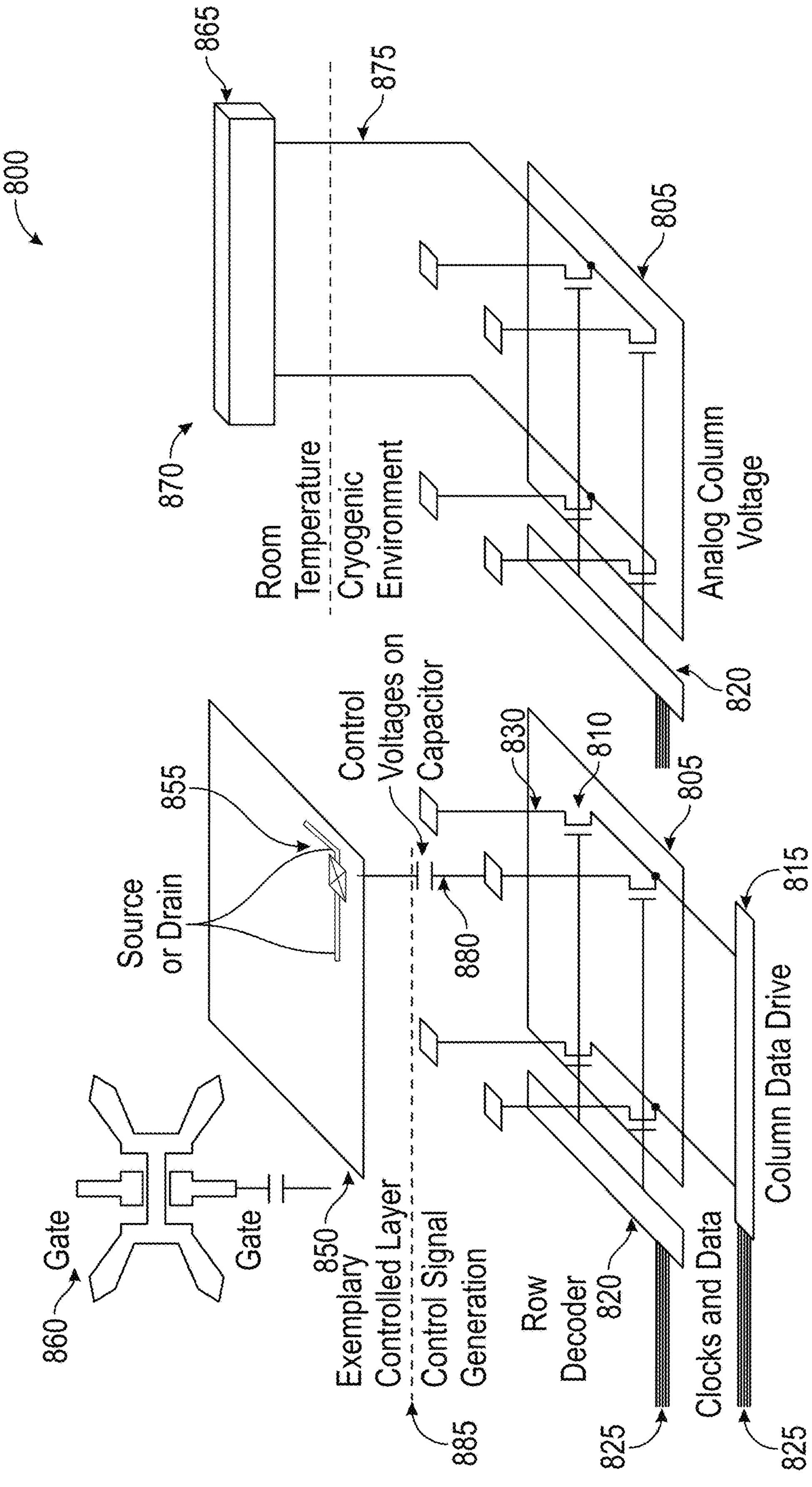
FIG. 8A depicts an analog or digital control signal generator implemented as a semiconductor-superconductor hybrid, in accordance with the disclosed embodiments.

In FIG. 8A an exemplary semiconductor-superconductor hybrid system 800 is illustrated. The semiconductor layer applies voltage-based signals to the gates of superconducting FETs, which translate the signals into a form readily used by superconducting circuits. The hybrid system 800 can be fabricated by using a CMOS wafer as a base for depositing superconductor circuits—in lieu of other methods using a blank silicon wafer as a base.

Specifically, the hybrid system 800 includes a control signal generation layer 805 with DRAM memory cells 810 that not only hold data for access from an external processor, but also "tap" each cell with a wire. The wire runs to another portion of the system 800 carrying the state of the cell as a digital control signal.

The hybrid system 800 includes a column data drive 815 that is operably connected to the control signal generation layer 805. A row decoder 820 is also operably connected to the control signal generation layer 805. Clock and data 825 can be connected to the row decoder 820 and/or the column data drive 815. An access transistor 830 can be provided on the control signal generation layer connections to the controlled layer 850.

The controlled layer 850 can include a Josephson weak link or resistor 855, associated with a Josephson junction 860 (illustrated in an exploded view). A signal generator 865 can be provided in the room temperature environment 870, and can be connected to the control signal generation layer 805 in the cryogenic environment 875

The DRAM-derived circuit 800 in FIG. 8A stores data on the capacitor plate 880 at the interface 885 between layers. The capacitor plate 880 can be the gate of a superconducting FET, and the effect of the control signal can be to control the critical current of the Josephson junction 860.

By using address, or row, decoders constructed from a cryogenic adiabatic logic, such as 2LAL, the process for updating the control signals can be fully adiabatic, meaning the energy for an update could vary with speed according to the quadratic curve illustrated in FIG. 4, including the energy to charge the capacitive loads of the DRAM cells 810 and the control signal.

The update process begins and ends in a reference state where all access transistors are in the off, or nonconducting, state and a copy of all the control signals are in the memory of an external processor.

Figure 8B:
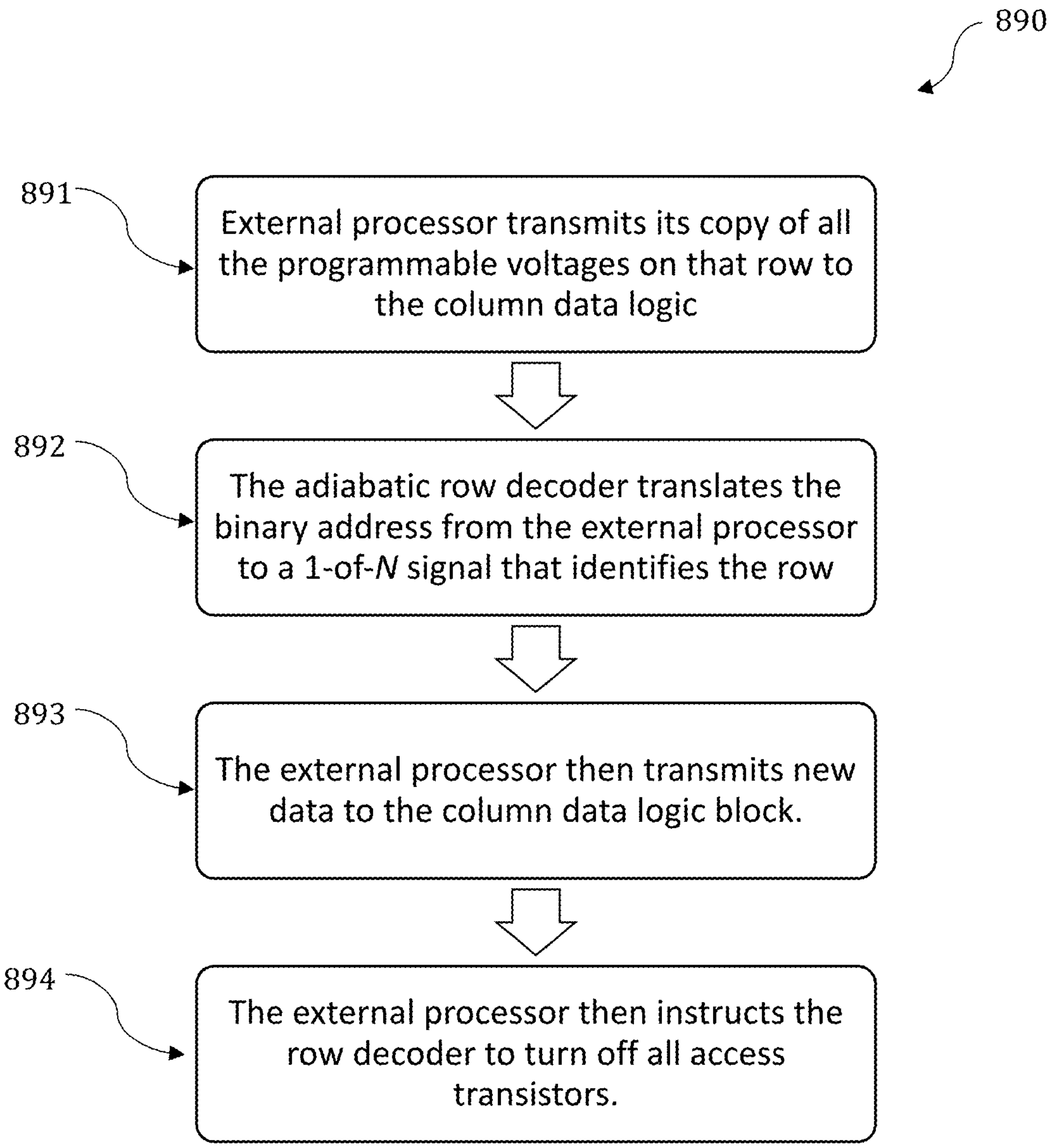
FIG. 8B depicts a method for implementing digital control signals, in accordance with the disclosed embodiments.

An associated method 890 is illustrated in FIG. 8B. To update the programmable voltages on a row at step 891, the external processor transmits its copy of all the programmable voltages on that row to the column data logic, which drives the control values to the source terminal of all the access transistors. The access transistors block further current flow because they are all turned off.

Next at step 892 the adiabatic row decoder translates the binary address from the external processor to a 1-of-N signal that identifies the row, driving the signal to the gates of all the access transistors on the selected row. The natural operation of the adiabatic logic charges the transistor gates with very low dissipation, again following the quadratic curve in FIG. 4. There is very little initial current flow through the transistors that turn on because the external processor used its copy of the control signal data to drive each column with the same voltage as the control signal at the row-column intersection—i.e. each transistor's source and drain will be at the same voltage when the transistors turns on.

At step 893, the external processor then transmits new data to the column data logic block. The natural operation of the adiabatic logic will charge or discharge the programmable voltages through the access transistors with very low power dissipation.

At step 894, the external processor then instructs the row decoder to turn off all access transistors. If the external processor retains the new signal values in its memory, the system will have been restored to the expected state between invocations of the method 890.

It should be noted that the high energy efficiency of adiabatic circuitry comes with some unusual properties. For example, a four-phase clocked logic family has been developed around 2LAL, which includes a signaling specification that requires each data signal to be valid during one of the clock phases. While a string of 0s in 2LAL produces a DC value at the clock's low voltage $V_L$, a string of 1s produces an AC signal that transitions between $V_L$ and the clock's high voltage $V_H$. The AC signal meets the signaling specification, but is in an unexpected state at all other times. This behavior is transparent when connecting 2LAL gates together, but the DRAM access transistors are not 2LAL gates so the complete signaling behavior must be considered.

The access transistors in FIG. 8A require certain voltages to function properly. Such source-gate voltages reliably turn the transistor on or off. The row decoder and column drive circuits can be driven by two separate sets of 2LAL clocks of the general form shown in FIG. 3. However, the external clock generator determines $V_L$ and $V_H$, which can be different for the two functions. In FIG. 8A, the row decoder's waveforms can swing from $V_{L,row}$ to $V_{H,row}$ and the column data drive waveforms can swing from $V_{L,data}$ to $V_{H,data}$. A transistor in the on state can see a source-gate voltage of $V_{H,row}-V_{L,data}$, and similarly for the off state. In certain embodiments, these voltages lead to two sets of four combined clock and power supply signals.

It should be appreciated that the embodiments herein use 2LAL as an example, but other logic families, such as SCRL, may be used in other embodiments. Instead of following the 2LAL convention of 0s being a DC level and 1s being an AC signal between $V_L$ and $V_H$, SCRL signals return to an intermediate value $(V_L+V_H)/2$ during certain phases of the clock. Each adiabatic logic family may have its own requirements.

Another aspect of the disclosed embodiments is the ability to create analog control signals, as illustrated on the right side of FIG. 8A. While adiabatic principles apply to analog signals, there isn't a general way of extending an adiabatic logic family like 2LAL to handle analog signals. However, the analog signals only appear on the columns, so only the column data needs to be adapted to the drive that portion of FIG. 8A.

In lieu of an adiabatic digital column driver, such an embodiment can include running wires for each column to an analog voltage generator at room temperature. If the voltage generator follows the protocol for the column data drive 815, the energy efficiency will follow the quadratic curve in FIG. 4.

However, other applications may require high-speed analog signals, such as the high-speed pulses. The high-speed pulses in such a situation will pass through resistive transistor channels and dissipate power, but the disclosed embodiments nonetheless improve the energy efficiency of the row decoding.

Figure 9:
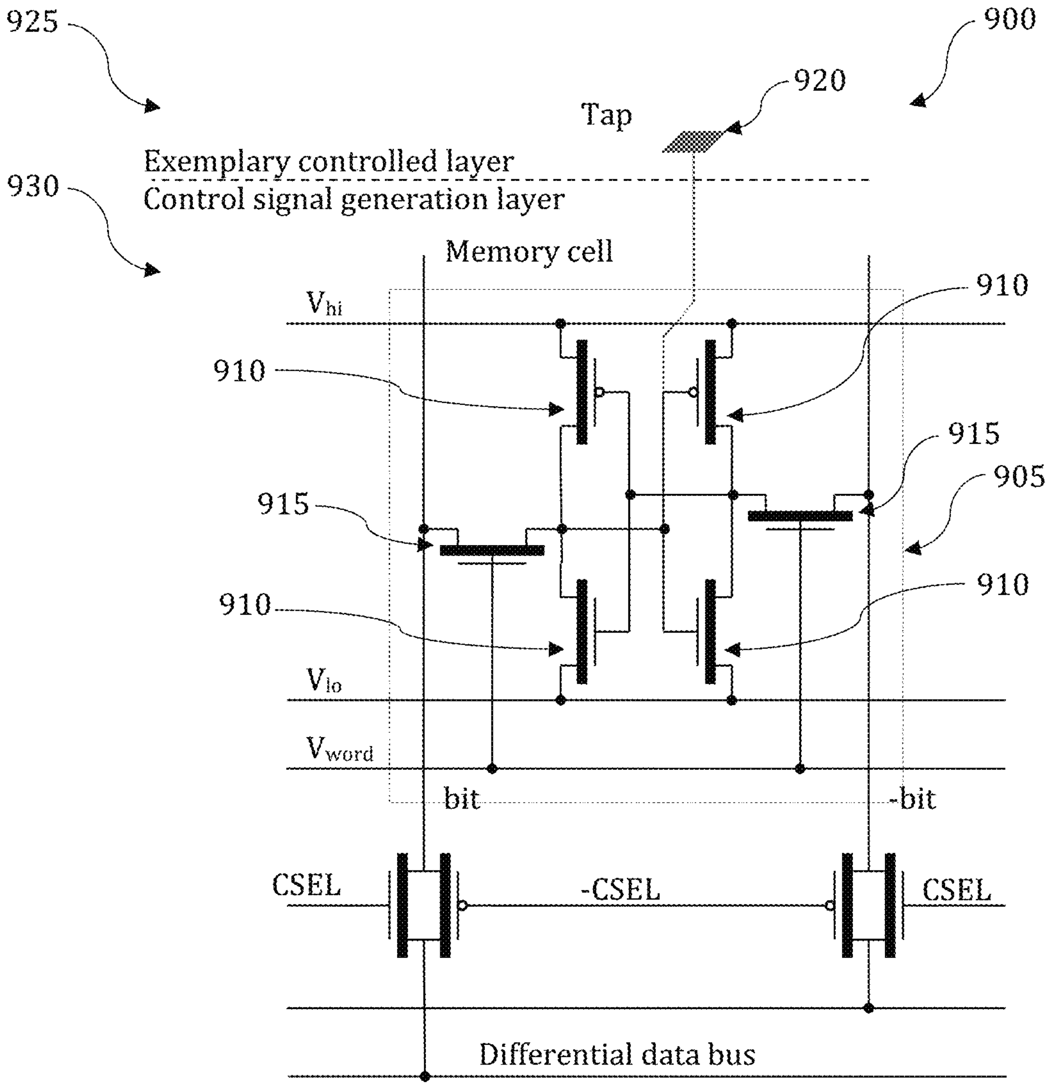
FIG. 9 depicts modifications to an adiabatic memory to make digital control signals, in accordance with the disclosed embodiments.

FIG. 9 illustrates an alternative embodiment comprising an adiabatic memory 900, similar to conventional SRAM, with taps. The main cell 905 is disposed on the control signal generation layer 930 and comprises four transistors 910 in a cross-coupled inverter configuration and two access transistors 915. Unlike conventional SRAM where cells receive DC power, the cell's power comes from row and column wires. Each cell 905 is connected to a tap 920 that interfaces between the control signal generation layer 930 and the controlled layer 925. The adiabatic SRAM circuit 900 replaces a single access transistor per bit, as shown in FIG. 9, with four transistors in a cross-coupled inverter configuration, connected between two floating power supplies.

CMOS addressing logic in a standard SRAM operates at the power levels of base level (as shown in Table 1), which is strong enough to overpower the cross-coupled inverters in the storage cell. An adiabatic SRAM uses adiabatic logic for address decoding. However, overpowering the single digital signal in the memory cell would create more heat than the entire rest of the memory, at least at the speed of scaling step 3 of table 1. Since the power in the adiabatic memory comes from the row and column drive, individual cells can be essentially powered down adiabatically, switched, and then powered up adiabatically in a new state.

Figure 10A:
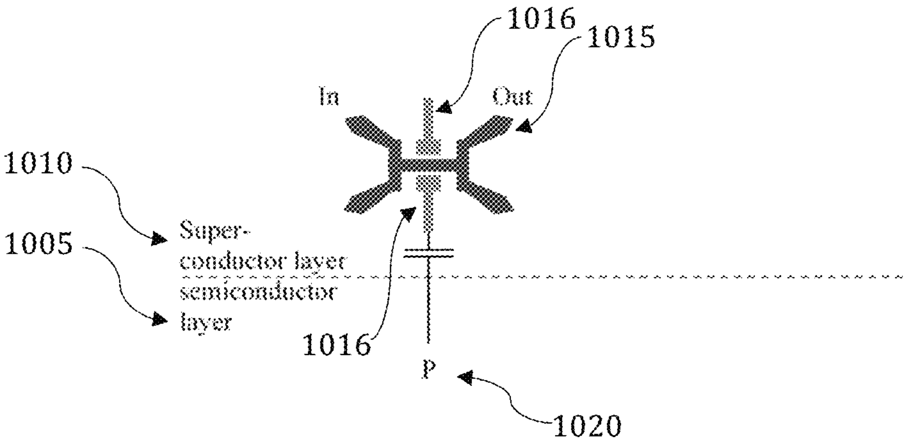
FIG. 10A depicts a voltage to Josephson-level current interface via a superconductor FET, in accordance with the disclosed embodiments.
Figure 10B:
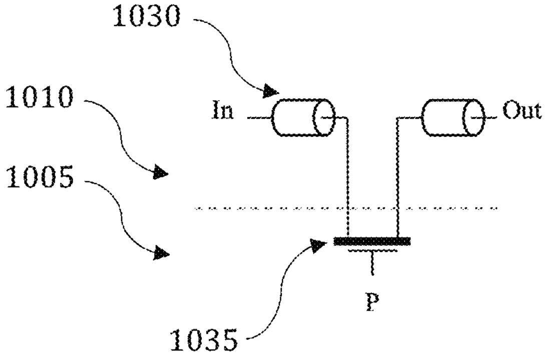
FIG. 10B depicts a voltage to Josephson-level current interface via an SFQ pulse interrupter, in accordance with the disclosed embodiments.
Figure 10C:
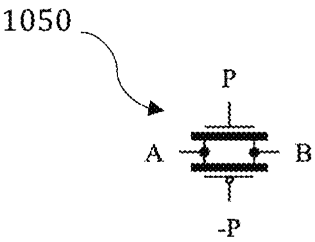
FIG. 10C depicts a voltage to Josephson-level current interface via a pass gate, in accordance with the disclosed embodiments.

FIG. 8A and FIG. 9 illustrate how a DRAM-type control signal can influence an SFQ circuit on another layer. FIGS. 10A-10C illustrate additional embodiments. Both DRAM- and SRAM-generated signals provide a voltage that can influence other parts of the system through an electric field.

Three options for using the control signals are illustrated in FIGS. 10A-10C. In FIG. 10A control voltages 1020 pass from the semiconductor layer 1005 to the superconductor layer 1010 and then influence a superconductor FET 1015. In FIG. 10B an SFQ pulse, generated in the superconductor layer 1010, passes to the semiconductor layer 1005 via an ohmic (i.e. non-superconducting) wire 1030, passes through a large, but otherwise ordinary, transistor 1035, and back to the superconductor layer. If the transistor is on, the SFQ pulse becomes somewhat attenuated, if off, the SFQ pulse is almost entirely blocked. FIG. 10C illustrates a pass gate 1050 for controlling other parts of the semiconductor layer.

FIG. 10A includes a superconducting field-effect transistor (FET) 1015. A superconducting wire can conduct current horizontally with zero resistance. However, a narrow superconducting wire only conducts with zero resistance up to a maximum current, called the critical current, above which the device becomes a resistor. A wire used in this way is called a weak link.

Superconductivity can be disrupted by an electric field, such as the field due to the programmable voltage across the capacitor (for example in FIG. 8A or FIG. 9). The superconducting FET 1015 has a weak link critical current that changes when the voltage structure 1016 applies more voltage, positive or negative. In certain embodiments the drive voltage can be as low as 2.5 V, which is a reasonable voltage swing for transistorized circuits. This supports a structure, like system 800 shown in FIG. 8A, where CMOS voltage signals are converted to SFQ current signals.

FIG. 10B illustrates a semiconductor FET that serves to interrupt an SFQ pulse. SFQ pulses propagate efficiently along transmission lines, which have a characteristic impedance (e.g. around 15Ω for Niobium superconductor chips at 4 K, leading to SFQ pulse dimensions of about 1 mV×2 ps). If such an SFQ signal is routed through a semiconductor FET, with a sufficiently low on resistance (e.g. approximately 15Ω), the pulse will pass with some attenuation. If the transistor is off, it doesn't pass at all. Thus, a control signal can influence the SFQ circuit by blocking or passing an SFQ pulse. The energy consumed is just the energy in the pulse, if the pulse is destroyed or attenuated.

FIG. 10C illustrates a control voltage influencing more semiconductor circuitry. If the control voltage is applied to the gate of a semiconductor FET, the FET can act as an SPST switch, with the control voltage shorting the source and drain or leaving an open circuit. The CMOS transmission gate previously illustrated in FIG. 3 has similar properties, but requires two transistors and complementary control signals.

In another embodiment, the systems and methods disclosed herein can be used to yield an improved cryogenic field programmable gate array (FPGA). This can be realized in at least two ways, both using 2LAL control signals to configure the FPGA's programmable logic. In one embodiment, the programmable logic is RQL on a separate layer with the principle advantage that valuable space on the Josephson junction layer is not taken up with configuration logic unnecessarily. In the second embodiment, the programmable logic is also CMOS or 2LAL on the same layer, with the advantage being in energy efficiency during reconfiguration.

Figure 11:
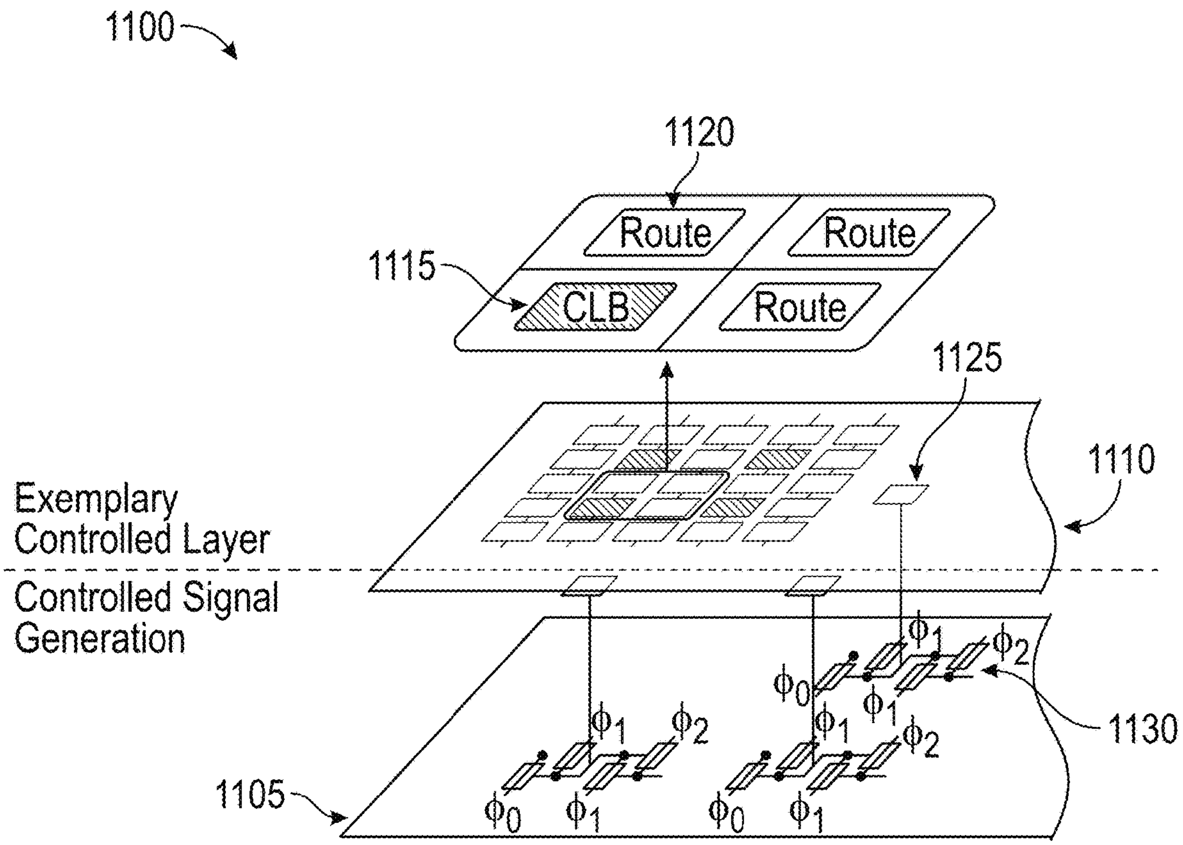
FIG. 11 depicts a semiconductor-superconductor hybrid FPGA, in accordance with the disclosed embodiments.

An FPGA generally comprises an array of configurable logic blocks (CLBs) connected by a programmable routing network, as shown in FIG. 11. The FPGA simulates an integrated circuit by configuring each CLB to be the equivalent of a few gates. The routing network is configured to replicate an integrated circuit's wiring pattern or netlist. Just as memories are manufactured without any data, FPGAs are manufactured without a specific function. A configuration string sets the FPGA's function during the boot process.

FIG. 11 illustrates the basic structure of an FPGA 1100 comprising configurable logic blocks 1115 (CLBs) connected by a network of routers 1120 whose overall routing pattern is controlled by setting control signals arriving from the control signal generation layer. Control signals give each CLB 1115 a specific identity and set the routing pattern to duplicate a logic design. The embodiment uses two layers, a control signal generation layer 1105 and a controlled layer 1110, thus benefitting from the density (complexity) of the semiconductor control signal generation and the high-speed/low-power characteristics of the Josephson junction-based controlled logic.

For example, a CLB 1115 can support Boolean AND, OR, NOT, and a half adder, with two control signals selecting one of the four functions. Likewise, control signals for routers can specify whether data continues in the same direction, turns left, turns right, or connects to the nearest gate. In both cases, the control signals can be generated by adiabatic transistor logic such as 2LAL register stages 1130. If the programmable logic is RQL, the voltage-based signals would be transformed to SFQ via the structures shown in FIGS. 10A-10C.

CMOS FPGAs have bidirectional pass gates, yet Josephson junctions are not easily configured to pass signals in both directions. As a consequence, superconductor FPGAs can use only unidirectional connections, but require more of them, resulting in higher overhead than equivalent CMOS FPGAs. Superconductor FPGAs can also be created using a magnetic Josephson junction (MJJ) as the underlying programmable device. An MJJ has an internal magnet whose field can point in one of two directions. The MJJ's internal state causes its critical current to change, effectively disabling circuits that depend on a specific critical current. Selective disablement is the method influencing the configurable logic to create the desired function.

One embodiment of the improved FPGA, is to combine the control signal generation layer in FIG. 8A or FIG. 9 with the superconductor FPGA, replacing the MJJs with the superconductor FETs. The superconductor FETs are not essential and the transistorized SFQ interrupter in FIG. 10 could be also be used.

Quantum computer control electronics can be realized according to the embodiments disclosed herein. Distributing the control function across multiple temperatures is a requirement for continued scaling. For example, only passive analog devices and digital multiplexers can be placed at the coldest temperature stages. Digital controllers are necessary, but they are only viable at 4 K or higher. As such, in certain embodiments, the controller can be partitioned both functionally and across different temperatures to meet limitations on devices, materials, and architectures.

Quantum computers based on spin qubits can also use the architecture of system 200 in FIG. 2, in accordance with the disclosed embodiments. Spin qubits are electrons loosely bound to a location in a material, such as through a donor atom or a quantum dot. Spin qubits require low temperatures. Each qubit type requires control signals with certain properties, such as DC, AC, microwave, various noise levels, and so forth. For example, in some cases physical I/O requirements for quantum dot qubits include: 1) an independent DC voltage on every qubit (site) up to ±1 V; 2) an independent voltage pulse with sub-ns rise times on every qubit up to tens of mV; and 3) an independent microwave magnetic or electric field at every site, typically −40 to −20 dBm, 1-50 GHz bursts of 10 ns to 1 µs duration.

Figure 12:
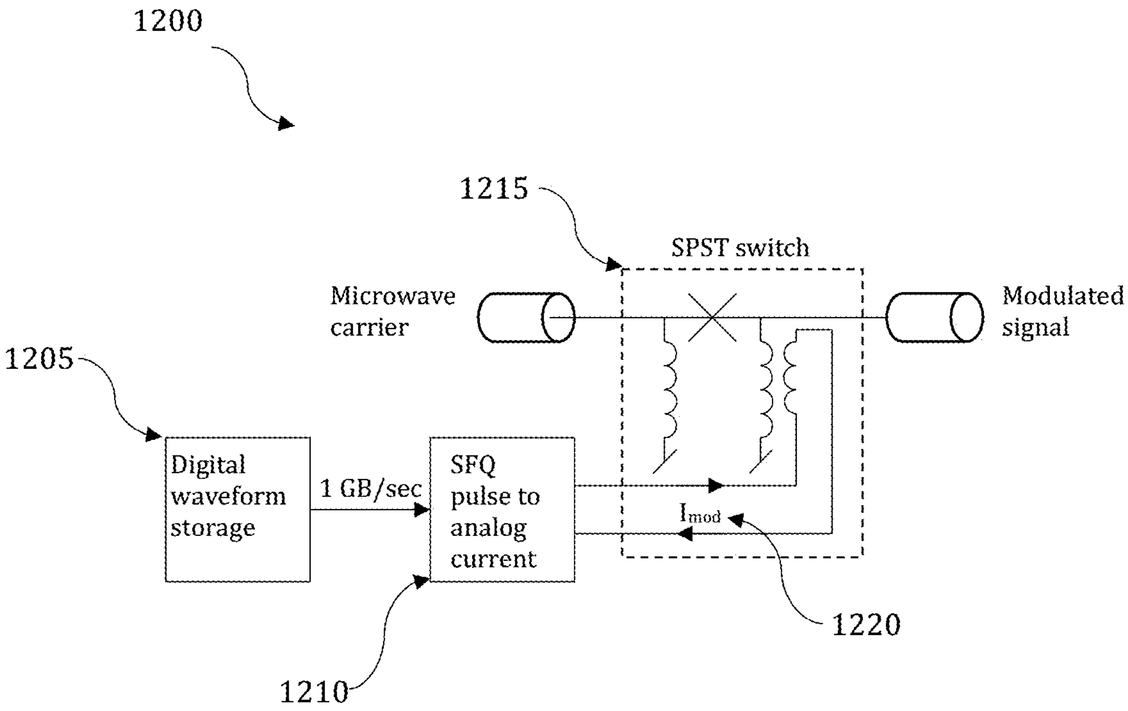
FIG. 12 depicts a controlled microwave pulse modulation system, in accordance with the disclosed embodiments.

Superconducting qubits can be controlled with SFQ pulses directly. In accordance with the disclosed embodiments, this allows reconfigurable FPGA logic to create SFQ pulses that interact with qubits directly and with no per-qubit external wiring. FIG. 12 illustrates the preferred approach for generating these pulses according to the disclosed embodiments, which is to use slower but more complex transistor circuits to control a smaller number of high-speed analog microwave components built from Josephson junctions.

FIG. 12, thus illustrates a system 1200 for controlled microwave modulation. The values provided in FIG. 12 are exemplary and other values may be used without departing from the scope of the embodiments. Pulse envelopes can be stored in a memory-like shift register 1205 (as illustrated in FIG. 7). The pulse envelopes can be speed matched to RQL's faster clock. The gigabyte/second stream provides the control signal to a superconductor D-A converter 1210 that generates analog currents, $I_{mod}$ 1220. The digitally controlled current becomes the flux control for an SPST microwave switch 1215. The current couples to the Josephson junction (an x) via mutual inductance, altering the transmission/reflection properties of the SPST switch 1215.

The first step is to store digitally encoded waveforms in the memory-like structure 1205, as illustrated in FIG. 7, and transfer it to the SFQ layer. The next step is to convert the digitally encoded waveform into an analog signal amenable to these microwave components, 1210, which is a typically a current. Current sources controlled by RQL are an option, which typically produce a low-bandwidth modulation signal $I_{mod}$. The next step is to use one of the microwave switches, modulators, or other such components associated with the quantum computer for controlling microwave signals with currents, 1215, which are typically generated by current sources at room temperature and transported through the temperature gradient on a microwave transmission line. However, in the preferred embodiment, the $I_{mod}$ generated in situ controls the modulator 1215. FIG. 7 also shows a feedback path from the high-speed electronics, allowing behavior in the payload to influence waveforms.

The embodiments herein can thus be directed to a cold, scalable controller. The suite of components disclosed herein can be used to create the preferred system-level embodiment. The controller can be described as an RQL-adiabatic transistor hybrid and/or a cryo CMOS-adiabatic transistor hybrid.

The controller can be capable of generating complex control sequences at high speed and with low power. A transmon quantum computer controller can be used as an example, where the controller needs to produce control sequences for calibration, qubit initialization, quantum computer arithmetic, and qubit readout.

Figure 1B:
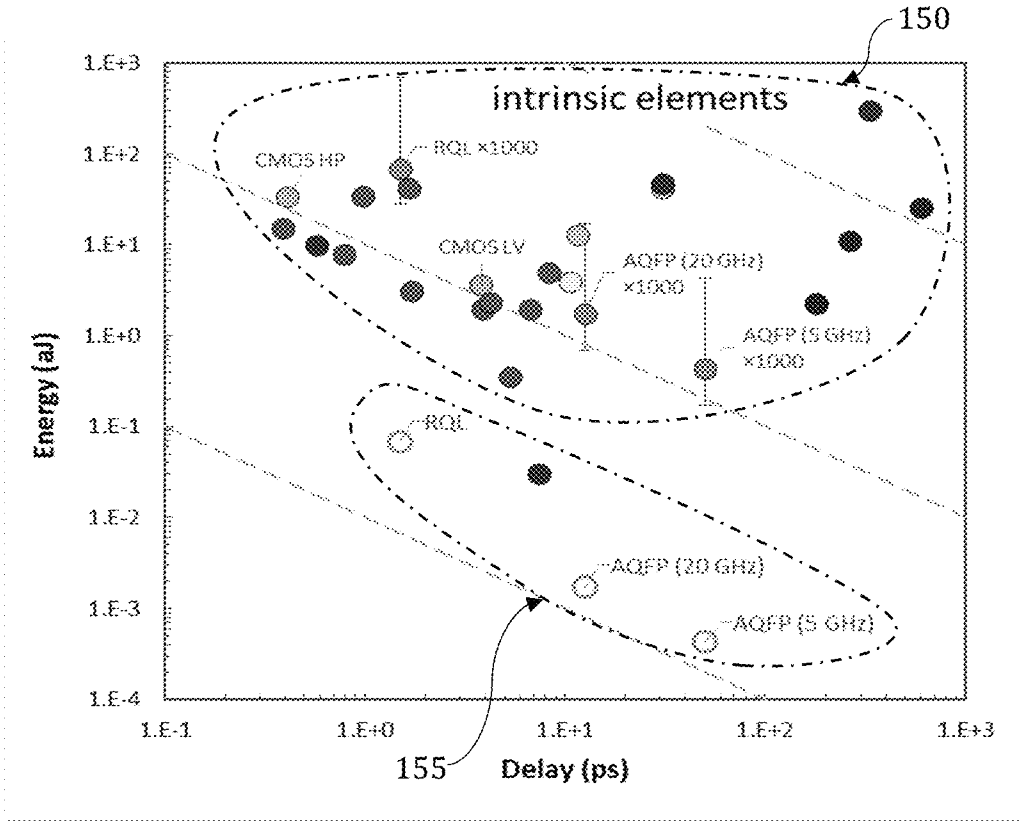
FIG. 1B depicts an energy delay plot for logic devices associated with the disclosed embodiments.

While FIG. 1B shows that RQL meets the speed and power requirements, and FIGS. 10A-10C shows how to generate control signals, RQL gates are about 10,000× the size of CMOS gates, thus limiting the complexity of the controller that can fit on a chip.

The preferred embodiment raises the complexity limit by organizing the RQL logic into an FPGA as illustrated in FIG. 11, or another reconfigurable structure. The RQL logic is then reconfigured on the fly to produce the control sequences one at a time, thus increasing the apparent number of SFQ gates by a principle similar to timesharing.

However, the control sequences should follow one another without the control signals stopping during reconfiguration and stalling the quantum computer, not only wasting time but perhaps allowing the system's state to decay, such as qubits decohering. To reduce the possibility of stalls, the embodiments can include a configuration buffer, as illustrated in FIG. 13.

Figure 13:
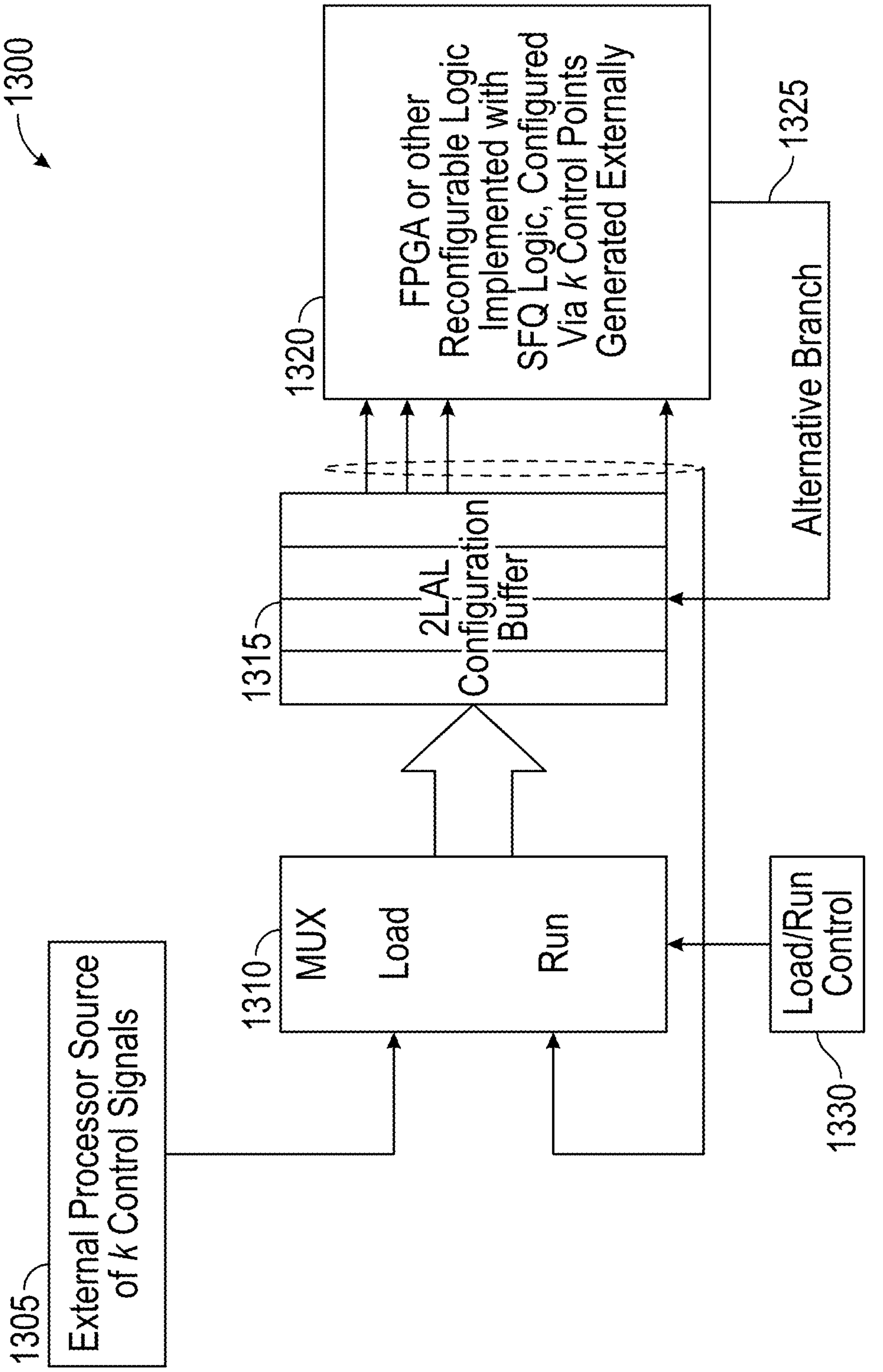
FIG. 13 depicts a semiconductor-superconductor hybrid subsystem that can be rapidly reconfigured, in accordance with the disclosed embodiments.

For example, as illustrated in FIG. 13, a system 1300 can have four modes of operation, each of which is specified by an FPGA with k configuration bits or control points. An external processor 1305 directs the source of control signals to create four sets of k control signals sequentially. With the multiplexer 1310 set to select the load input using the load/run control 1320, the four sets are loaded into the k-bit wide, four-stage shift register 1315. Switching the multiplexer 1310 to the run position, each clock of the shift register 1315 exposes the FPGA reconfigurable logic 1320 to the next mode in rotating sequence. While the 2LAL shift register 1315 must be clocked at, for example 4 MHz, for energy efficiency, this is fast enough to completely reconfigure the FPGA 1320 within the decoherence time of a qubit. As an option, the path labeled "potential branch" 1325 could convey information from the controlled payload that forces a reconfiguration, including to a configuration out of the normal rotation pattern, thus giving reconfiguration some of the capability of a standard computer's branch instruction.

The configuration buffer can comprise a k-bit wide by 4-stage cyclic 2LAL shift register 1320, where the number k corresponds to the number of FPGA configuration bits and the buffer's k-bit output is used as a form of tapped memory to configure the FPGA.

An exemplary operating sequence associated with the system 1300 illustrated in FIG. 13, using rough timing numbers, is provided below. It should be appreciated that this example is for illustrative purposes, and other operational parameters and numbers may be used in other embodiments.

After power-on, an external processor loads the four k-bit configuration sequences into the k×4-bit configuration buffer. This can be done serially and can take less than a few seconds. The configuration buffer is shifted so the FPGA configuration for calibration appears on the k outputs, leaving the RQL FPGA ready to calibrate the transmons. The RQL clock is turned on at, for example, 5 GHz, and generates the calibrating sequence until the external processor decides to turn off the RQL clock.

The external processor commands the clock generator (as shown in FIG. 3) to create four phases of the 4 MHz combined clock and power supply, rotating the contents of the configuration buffer in 250 ns so the configuration for qubit initialization appears. The RQL clock is turned on and performs qubit initialization, which takes, say 5 μs, after which the external processor turns off the RQL clock.

The external processor commands the clock generator to shift the configuration buffer again, loading the quantum computer arithmetic configuration in 250 ns. The RQL clock is turned on for, say 100 μs, or however long the qubits can operate without undue risk of decohering. The external processor shifts to the readout configuration, performs readout, and the process completes.

This controller is viable because the timings fit with each other. While the cryogenic adiabatic transistor circuits must run slowly due to the slow speed of the gates in scaling step 3 of table I, the architecture proposed in FIGS. 7 and 13 can carry out an FPGA reconfiguration in 250 ns. While 250 ns is a long time compared to the 200 μs clock period of RQL, it is much shorter than the decoherence time of current qubits. Thus, the embodiments are useful with both the technology present at the time of this writing and are expected to improve further as transmon coherence times improve through expected advances in that technology.

However, FIG. 13 also includes a feedback path (i.e. "alternative branch" 1325) for adaptive control. Each configuration can allocate a small amount of RQL logic to detect conditions that require a complex response. For example, a quantum error correction circuit will usually conclude that there has been no error. In the improbable but important circumstance that an error is detected, the error correction process may be complex enough to require reconfiguration of the FPGA to generate a completely different control sequence. So, the RQL branch signal can force a change in the shift register without direct involvement of the external processor. Other embodiments can allow a jump to a configuration outside the normal rotation pattern, giving the FPGA reconfiguration some of the capability of a standard computer's branch instruction.

There are multiple other embodiments of the configuration buffer. The configuration buffer can be a shift register of different dimensions, a structure with an access pattern different from a cycle, or multiple copies of itself running independently. The system does not have to be exclusively dedicated to controllers. For example, the system could have independent control signal generators such as in FIG. 8A or FIG. 9, or special memories as in FIG. 7.

In addition to the four exemplary quantum computer control sequences, control sequences can be created for different quantum error correction codes, such as 5-bit, 7-bit, or surface codes. This can allow a quantum computer to support any code without changing hardware. The same controller architecture can apply to a cryogenic sensor array that identifies extrasolar planets via a control sequence in the FPGA. The FPGA configuration can change as more is known about a potential planet, or as improved algorithms are discovered. This also applies to subroutines in either classical or quantum algorithms. One algorithm might use 8-bit integer data types whereas another might use 150-bit integers. In fact, a single algorithm might use integers of several word sizes. A control sequence can be developed for each different integer size and loaded into the FPGA on demand.

The embodiments herein are directed to a cold, scalable controller that not only implements the cryogenic adaptation of Rent's rule for scaling, and also uses cryogenic adiabatic transistors circuits as a highly flexible technology that can form a hybrid with multiple alternative technologies, at multiple temperatures, and in consideration of various energy-delay tradeoffs.

The embodiments illustrated herein have had three stages defined at nominally 300 K, 4 K, and 0.015 K respectively, but alternative embodiments can be created for two or more stages at any temperatures down to a temperature ratio of 10:1 between the warmest and coldest. It should be understood that the embodiments are still viable in other temperature ratios (e.g. 2:1), with the expectation that some of the benefits of the disclosed embodiments decrease as the temperature of the stages converge toward a single temperature. The term “room temperature” is used to represent the approximate temperature of earth's environment, which is the heat bath for terrestrial systems. However, embodiments can be extended to other environments where the heat bath is at a lower temperature, such as space, or higher temperature, such as under the Earth's surface.

CMOS HP and RQL have been described as technology examples for the hybrid because their parameters are readily available, as illustrated in FIG. 1B. However, other Beyond CMOS devices may also be used in the context of cryogenic operation. There are also other circuit designs that will have the same qualitative behavior as CMOS, 2LAL, and RQL such as Split-Level Charge Recovery Logic (SCRL), Efficient Charge Recovery Logic (2N2P or ECRL), 2N2N2P, Positive Feedback Adiabatic Logic (PFAL), Differential Cascode Pre-resolve Adiabatic Logic (DCPAL), Energy-efficient Rapid Single Flux Quantum (ERSFQ), Adiabatic Quantum Flux Parametron (AQFP), and purpose-built adiabatic memories, all of which can be implemented in accordance with embodiments disclosed herein.

Figure 14:
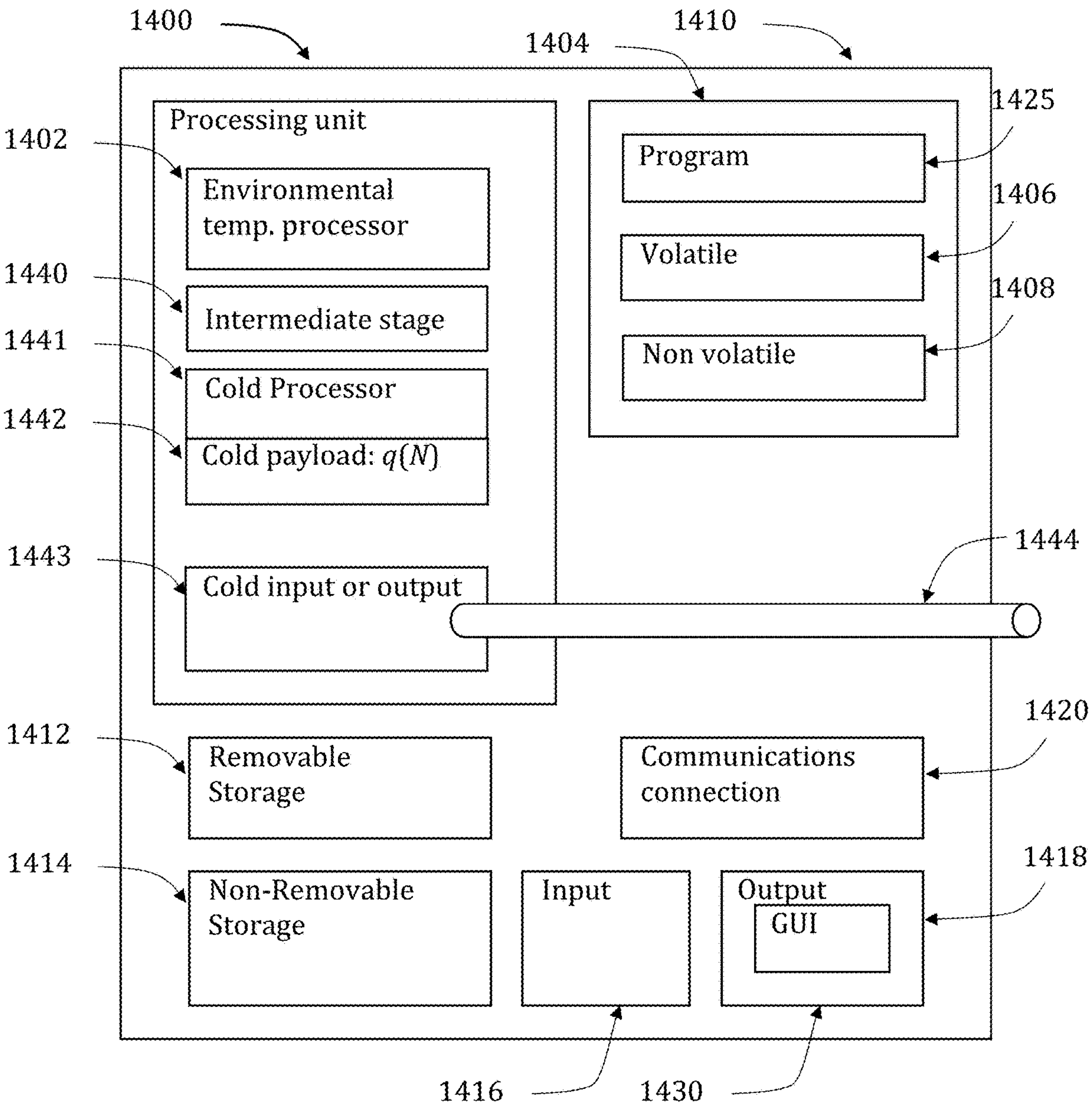
FIG. 14 depicts a block diagram of a computer system which is implemented in accordance with the disclosed embodiments.
Figure 15:
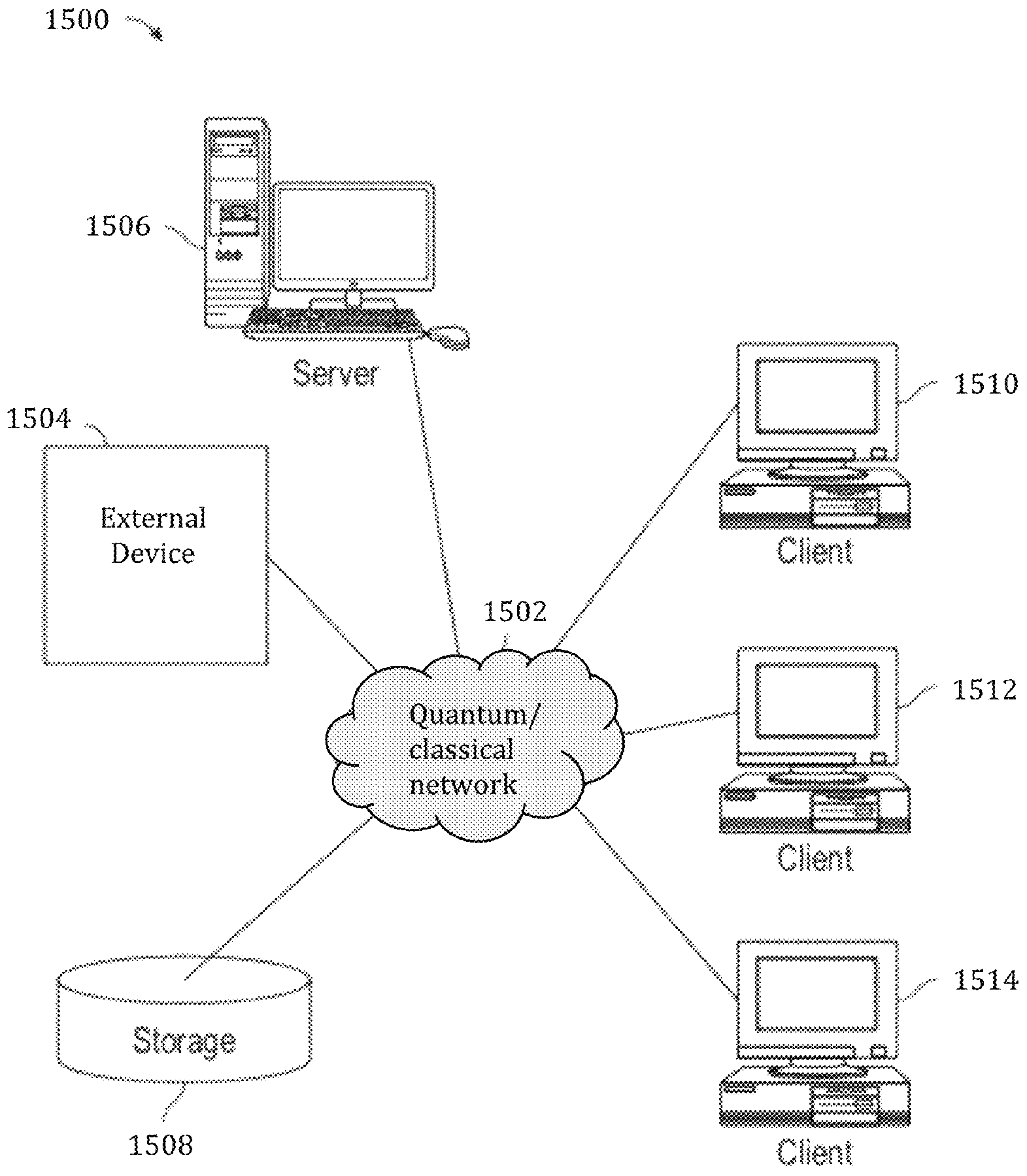
FIG. 15 depicts a graphical representation of a network of data-processing devices in which aspects of the present embodiments may be implemented.
Figure 16:
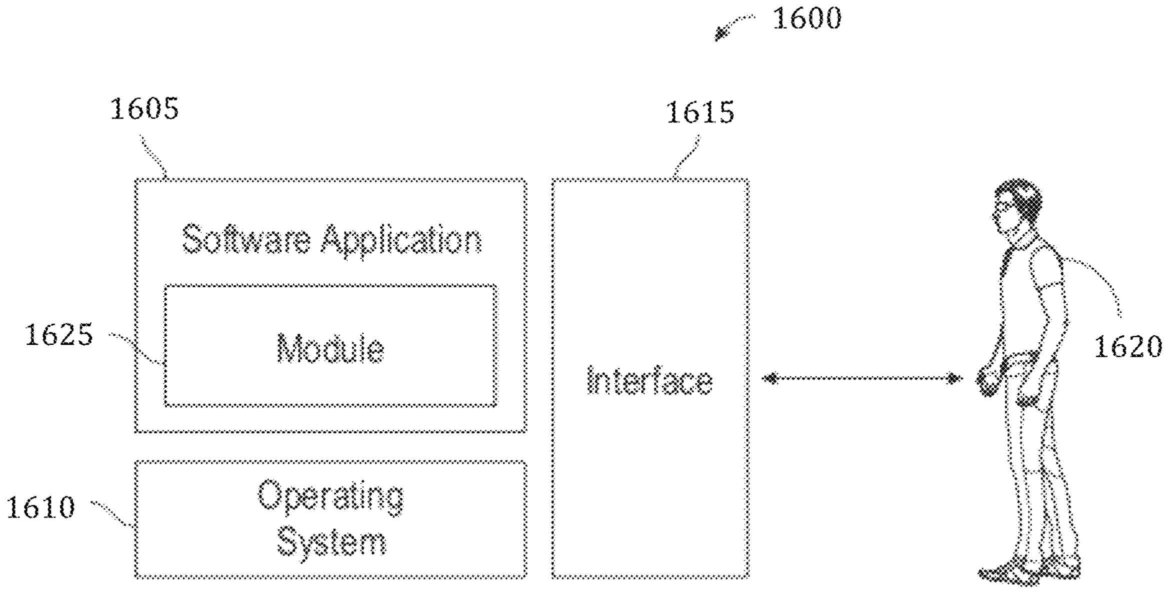
FIG. 16 depicts a computer software system for directing the operation of the data-processing system depicted in FIG. 14, in accordance with an embodiment.

FIGS. 14-16 are provided as exemplary diagrams of data-processing environments in which embodiments of the present invention may be implemented. It should be appreciated that FIGS. 14-16 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a cold-capable computer system 1400 that executes programming for implementing parts of the methods and systems disclosed herein is shown in FIG. 14. A computing device in the form of a computer 1410 includes one or more processing units 1402 operating at the environmental, or room, temperature, each of which may include additional processing units 1440 and 1441 operating at lower temperatures t, designated as performing function $f_t$ and a payload 1442 operating at the lowest temperature and performing function designated q(N), where N is the computational scale. The payload may contain additional input and or output 1443 for data at the lowest temperature which may connect to the external world via a tunnel 1444 to the environmental temperature. Processor 1402 is configured to interface with sensors, peripheral devices, and other elements disclosed herein may include memory 1404, removable storage 1412, and non-removable storage 1414. Memory 1404 may include volatile memory 1406 and non-volatile memory 1408. Computer 1410 may include or have access to a computing environment that includes a variety of transitory and non-transitory computer-readable media such as volatile memory 1406 and non-volatile memory 1408, removable storage 1412 and non-removable storage 1414. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data including image data.

Computer 1410 may include or have access to a computing environment through cold input or output 1443, input 1416, output 1418, and a communication connection 1420. The computer may operate in a networked environment using a communication connection 1420 or cold input or output 1443 to connect to one or more remote computers, remote sensors, detection devices, hand-held devices, multi-function devices (MFDs), mobile devices, tablet devices, mobile phones, Smartphones, or other such devices. The remote computer may also include a personal computer (PC), server, router, network PC, RFID enabled device, a peer device or other common network node, or the like. The communication connection may include a Local Area Network (LAN), a Wide Area Network (WAN), Bluetooth connection, or other networks. This functionality is described more fully in the description associated with FIG. 15 below.

Output 1418 is most commonly provided as a computer monitor, but may include any output device. Output 1418 and/or input 1416 may include a data collection apparatus associated with computer system 1400. In addition, input 1416, which commonly includes a computer keyboard and/or pointing device such as a computer mouse, computer track pad, or the like, allows a user to select and instruct computer system 1400. A user interface can be provided using output 1418 and input 1416. Output 1418 may function as a display for displaying data and information for a user, and for interactively displaying a graphical user interface (GUI) 1430.

Note that the term “GUI” generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 1416 such as, for example, a pointing device such as a mouse and/or with a keyboard. A particular item can function in the same manner to the user in all applications because the GUI provides standard software routines (e.g., module 1425) to handle these elements and report the user's actions. The GUI can further be used to display the electronic service image frames as discussed below.

Computer-readable instructions, for example, program module or node 1425, which can be representative of other modules or nodes described herein, are stored on a computer-readable medium and are executable by the processing unit 1402 of computer 1410. Program module or node 1425 may include a computer application. A hard drive, CD-ROM, RAM, Flash Memory, and a USB drive are just some examples of articles including a computer-readable medium.

FIG. 15 depicts a graphical representation of a quantum-enhanced network of data-processing systems 1500 in which aspects of the present invention may be implemented. Quantum-enhanced network data-processing system 1500 is a network moving either classical data or quantum, qubit-based data amongst computers or other such devices such as mobile phones, smartphones, sensors, detection devices, controllers and the like in which embodiments of the present invention may be implemented. Note that the system 1500 can be implemented in the context of a software module such as program module 1425. The system 1500 includes a network 1502 in communication with one or more clients 1510, 1512, and 1514. Quantum/classical network 1502 may also be in communication with one or more device 1504, servers 1506, and storage 1508. Quantum/classical network 1502 is a medium that can be used to provide communications links between various devices and computers connected together within a networked data processing system such as computer system 1400. Quantum/classical network 1502 may include connections such as wired communication links, wireless communication links of various types, fiber optic cables, quantum, or quantum encryption, or quantum teleportation networks, etc. Some types of quantum, qubit-based data will need to connect through special cold electronic portals such as 1444. Quantum/classical network 1502 can communicate with one or more servers 1506, one or more external devices such as the external processor 1305, a controller, actuator, sensor, or other such device 1504, and a memory storage unit such as, for example, memory or database 1508. It should be understood that device 1504 may be embodied as an external processor 1305, detector device, microcontroller, controller, receiver, transceiver, or other such device.

In the depicted example, device 1504, server 1506, and clients 1510, 1512, and 1514 connect to quantum/classical network 1502 along with storage unit 1508. Clients 1510, 1512, and 1514 may be, for example, personal computers or network computers, handheld devices, mobile devices, tablet devices, smartphones, personal digital assistants, microcontrollers, recording devices, MFDs, other cold-capable computer systems, etc. Cold-capable computer system 1400 depicted in FIG. 14 can be, for example, a client such as client 1510 and/or 1512.

Cold-capable computer system 1400 can also be implemented as a server such as server 1506, depending upon design considerations. In the depicted example, server 1506 provides data such as boot files, operating system images, applications, and application updates to clients 1510, 1512, and/or 1514. Clients 1510, 1512, and 1514 and external device 1504 are clients to server 1506 in this example. Network data-processing system 1500 may include additional servers, clients, and other devices not shown. Specifically, clients may connect to any member of a network of servers, which provide equivalent content.

In the depicted example, network data-processing system 1500 is the Internet with network 1502 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 1500 may also be implemented as a number of different types of networks such as, for example, a quantum Internet, an intranet, a local area network (LAN), or a wide area network (WAN). FIGS. 14 and 15 are intended as examples and not as architectural limitations for different embodiments of the present invention.

FIG. 16 illustrates a software system 1600, which may be employed for directing the operation of the data-processing systems such as computer system 1400 depicted in FIG. 14. Software application 1605, may be stored in memory 1404, on removable storage 1412, or on non-removable storage 1414 shown in FIG. 14, and generally includes and/or is associated with a kernel or operating system 1610 and a shell or interface 1615. One or more application programs, such as module(s) or node(s) 1425, may be "loaded" (i.e., transferred from removable storage 1414 into the memory 1404) for execution by the data-processing system 1400. The data-processing system 1400 can receive user commands and data through user interface 1615, which can include input 1416 and output 1418, accessible by a user 1620. These inputs may then be acted upon by the computer system 1400 in accordance with instructions from operating system 1610 and/or software application 1605 and any software module(s) 1425 thereof.

Generally, program modules (e.g., module 1425) can include, but are not limited to, routines, subroutines, software applications, programs, objects, components, data structures, etc., that perform particular tasks or implement particular abstract data types and instructions. Moreover, those skilled in the art will appreciate that elements of the disclosed methods and systems may be practiced with other computer system configurations such as, for example, hand-held devices, mobile phones, smart phones, tablet devices, multi-processor systems, printers, copiers, fax machines, multi-function devices, data networks, microprocessor-based or programmable consumer electronics, networked personal computers, minicomputers, mainframe computers, servers, medical equipment, medical devices, and the like.

Note that the term module or node as utilized herein may refer to a collection of routines and data structures that perform a particular task or implements a particular abstract data type. Modules may be composed of two parts: an interface, which lists the constants, data types, variables, and routines that can be accessed by other modules or routines; and an implementation, which is typically private (accessible only to that module) and which includes source code that actually implements the routines in the module. The term module may also simply refer to an application such as a computer program designed to assist in the performance of a specific task such as word processing, accounting, inventory management, etc., or a hardware component designed to equivalently assist in the performance of a task.

The interface 1615 (e.g., a graphical user interface 1430) can serve to display results, whereupon a user 1620 may supply additional inputs or terminate a particular session. In some embodiments, operating system 1610 and GUI 130 can be implemented in the context of a "windows" system. It can be appreciated, of course, that other types of systems are possible. For example, rather than a traditional "windows" system, other operation systems such as, for example, a real time operating system (RTOS) more commonly employed in wireless systems may also be employed with respect to operating system 1610 and interface 1615. The software application 1605 can include, for example, module(s) 1425, which can include instructions for carrying out steps or logical operations such as those shown and described herein.

The following description is presented with respect to embodiments of the present invention, which can be embodied in the context of, or require the use of a data-processing system such as computer system 1400, in conjunction with program module 1425, and data-processing system 1500 and network 1502 depicted in FIGS. 14-3. The present invention, however, is not limited to any particular application or any particular environment. Instead, those skilled in the art will find that the systems and methods of the present invention may be advantageously applied to a variety of system and application software including database management systems, word processors, and the like. Moreover, the present invention may be embodied on a variety of different platforms including Windows, Macintosh, UNIX, LINUX, Android, Arduino and the like. Therefore, the descriptions of the exemplary embodiments, which follow, are for purposes of illustration and not considered a limitation.

Based on the foregoing, it can be appreciated that a number of embodiments, preferred and alternative, are disclosed herein. It should be appreciated that variations of the above-disclosed and other features and functions, or alternatives thereof, may be desirably combined into many other different systems or applications. In an embodiment, a system comprises an adiabatic circuit configured in a cryogenic environment, an external processor connected to the adiabatic circuit, the processor configured in a room temperature environment, wherein the processor can load and update control signal values stored in the adiabatic circuit, and at least one capacitive node connected to an output of the adiabatic circuit thereby producing an AC/DC cryogenic control signal.

In an embodiment, the adiabatic circuit further comprises a 1-of-N decoder driving each row of an array of access transistors through a gate of each of the access transistors. In an embodiment, the system further comprises a cryogenic column driver circuit, wherein each source on the access transistors in each column of the array of access transistors connect to the column driver circuit. In an embodiment, the column driver circuit comprises an adiabatic circuit thereby making the column driver circuit cryogenic adiabatic, allowing multiplexing of at least two digital signals. In an embodiment, the system further comprises an access transistor drain associated with each access transistor in the array of access transistors, wherein the access transistor drain is connected to the at least one capacitive node thereby creating a control signal.

In an embodiment, the system further comprises a superconductor FET wherein the control signal connects to a gate of the superconductor FET. In an embodiment, the system further comprises a semiconductor FET where the control signal connects to a gate of the semiconductor FET. In an embodiment, the system further comprises at least one of: an SFQ interrupter and a pass gate. In an embodiment, the system further comprises a Josephson junction circuit, wherein the semiconductor FET passes and blocks an SFQ pulse from the Josephson junction circuit.

In an embodiment, the adiabatic circuit comprises a tapped adiabatic SRAM. In an embodiment, the control signals are provided to at least one Josephson junction-based microwave circuit.

In an embodiment, the system further comprises a Josephson junction FPGA-like structure, wherein the control signals configure the Josephson junction-based FPGA-like structure. In an embodiment, the Josephson junction FPGA-like structure comprises at least one configurable logic element, and a programmable routing network. In an embodiment, the system further comprises a configuration buffer configured to store configurations that can be switched. In an embodiment, the system further comprises a branch signal provided from the at least one configurable logic element to the configuration buffer, wherein the branch signal causes a configuration change to a new configuration.

In an embodiment, the system further comprises at least one transistor, wherein a leakage current of the at least one transistor is rebalanced for cryogenic operation.

In an embodiment, the system further comprises a clock rate, wherein the clock rate is a monotonic function of an operating temperature.

In an embodiment, a system comprises a spin qubit quantum computer, an adiabatic circuit configured in a cryogenic environment, an external processor connected to the adiabatic circuit in an room temperature environment, wherein the processor can load and update control signal values stored in the adiabatic circuit, and at least one capacitive node connected to an output of the adiabatic circuit producing a control signal, wherein the control signal controls quantum operations of the spin qubit quantum computer.

In yet another embodiment a system comprises an adiabatic memory configured in a cryogenic environment, a digitized waveform stored in the adiabatic memory, and at least one multiplexer that creates a faster digitized waveform by reducing the width of the digitized waveform while increasing its speed. In an embodiment, the faster digitized waveform is provided to at least one Josephson junction-based microwave circuit.

It should be understood that various presently unforeseen or unanticipated alternatives, modifications, variations or improvements therein may be subsequently made by those skilled in the art which are also intended to be encompassed by the following claims.

What is claimed is:

1. A system comprising:

a second stage comprising a Josephson junction circuit configured to contain information;

a first stage comprising a transistor circuit comprising logic and cells that store the information, wherein the information can be moved from the first stage to the second stage and the information can be moved from the second stage to the first stage; and at least one transistor, wherein a leakage current of the at least one transistor is rebalanced for cryogenic operation.

2. The system of claim 1 further comprising:

a qubit-containing payload, wherein the information is transferred to the payload.

3. The system of claim 1 further comprising:

an external processor connected to the transistor circuit, the external processor configured in a room temperature environment, wherein the external processor can load and update the information in the transistor circuit.

4. The system of claim 1 wherein the transistor circuit comprises an adiabatic circuit.

5. The system of claim 4 further comprising:

at least one clock and power supply configured in a room temperature environment, wherein the at least one clock and power supply is operably connected to the transistor circuit, wherein both power and time synchronization are provided to the transistor circuit.

6. The system of claim 2 further comprising:

a multiplexer associated with the transistor circuit, wherein information in the transistor circuit can be moved with different access rates.

7. The system of claim 1, wherein the Josephson junction circuit comprises configurable logic, wherein the configurable logic is configured by the information.

8. The system of claim 7 further comprising:

an alternative branch wire, wherein information on the alternative branch wire will influence configuration of the configurable logic.

9. The system of claim 8 further comprising:

a configuration buffer configured to store configurations that can be switched.

10. The system of claim 8 wherein information on the alternative branch wire identifies an error detected by a quantum error correction code.

11. The system of claim 2 further comprising:

a second Josephson junction circuit;

a microwave carrier transmission line configured as an input to the second Josephson junction circuit;

a modulated signal transmission line configured as an output of the second Josephson junction circuit, wherein the second Josephson junction circuit modulates information on the microwave carrier transmission line to yield information on the modulated signal transmission line based on the information, and wherein a modulated signal is transferred to a qubit.

12. The system of claim 1 wherein the Josephson junction circuit is configured as a single-flux quantum (SFQ) circuit.

13. The system of claim 2 wherein the transistor circuit comprises a tapped adiabatic SRAM, wherein information in the SRAM is transferred to the payload via taps.

14. The system of claim 1 further comprising:

a semiconductor FET that either passes or blocks an SFQ pulse based on the information.

15. A system comprising:

a second stage comprising a Josephson junction circuit comprising a single-flux quantum (SFQ) circuit configured to contain information;

a qubit-containing payload, wherein the information is transferred to the payload;

a first stage comprising a transistor circuit comprising a tapped adiabatic SRAM, wherein information in the SRAM is transferred to the payload via taps wherein the transistor circuit is configured to comprise logic and cells that store the information, wherein the information can be moved from the first stage to the second stage and the information can be moved from the second stage to the first stage.

16. The system of claim 15 further comprising:

an external processor connected to the transistor circuit, the external processor configured in a room temperature environment, wherein the external processor can load and update the information in the transistor circuit.

17. The system of claim 15 further comprising:

a multiplexer associated with the transistor circuit, wherein information in the transistor circuit can be moved with different access rates.

18. A system comprising:

a second stage comprising a Josephson junction circuit configured to contain information;

a first stage comprising a transistor circuit comprising logic and cells that store the information wherein the information can be moved from the first stage to the second stage and the information can be moved from the second stage to the first stage; and a semiconductor FET that either passes or blocks an SFQ pulse based on the information.

19. The system of claim 18 further comprising:

a qubit-containing payload, wherein the information is transferred to the payload.

20. The system of claim 18 further comprising:

a second Josephson junction circuit;

a microwave carrier transmission line configured as an input to the second Josephson junction circuit;

a modulated signal transmission line configured as an output of the second Josephson junction circuit, wherein the second Josephson junction circuit modulates information on the microwave carrier transmission line to yield information on the modulated signal transmission line based on the information, and wherein a modulated signal is transferred to a qubit.

* * * * *